United States Patent
Lien et al.

(10) Patent No.: US 11,508,450 B1
(45) Date of Patent: Nov. 22, 2022

(54) DUAL TIME DOMAIN CONTROL FOR DYNAMIC STAGGERING

(71) Applicant: Western Digital Technologies, Inc., San Jose, CA (US)

(72) Inventors: Yu-Chung Lien, San Jose, CA (US); Huai-Yuan Tseng, San Ramon, CA (US); Deepanshu Dutta, Fremont, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 39 days.

(21) Appl. No.: 17/351,455

(22) Filed: Jun. 18, 2021

(51) Int. Cl.
*G11C 16/10* (2006.01)
*G11C 16/34* (2006.01)
*G11C 16/26* (2006.01)
*G11C 16/32* (2006.01)

(52) U.S. Cl.
CPC ........ *G11C 16/3459* (2013.01); *G11C 16/102* (2013.01); *G11C 16/26* (2013.01); *G11C 16/32* (2013.01); *G11C 16/3418* (2013.01)

(58) Field of Classification Search
CPC .................................................. G11C 16/102
See application file for complete search history.

(56) References Cited

U.S. PATENT DOCUMENTS

| | | | |
|---|---|---|---|
| 10,013,345 B2 | 7/2018 | Erez et al. | |
| 10,120,817 B2 | 11/2018 | Margetts et al. | |
| 10,365,703 B2 | 7/2019 | Ha et al. | |
| 11,373,710 B1* | 6/2022 | Hsu | G11C 16/30 |
| 2011/0173462 A1 | 7/2011 | Wakrat et al. | |
| 2013/0301372 A1* | 11/2013 | Park | G11C 7/22 365/227 |
| 2017/0256955 A1 | 11/2017 | Addepalli et al. | |
| 2020/0042238 A1* | 2/2020 | Jung | G06F 3/0679 |
| 2021/0373795 A1* | 12/2021 | Lee | G06F 3/0634 |

* cited by examiner

*Primary Examiner* — Douglas King
(74) *Attorney, Agent, or Firm* — ArentFox Schiff LLP

(57) ABSTRACT

Aspects of a storage device including a memory and a controller are provided. The memory can include memory dies that draw a current from a current source during a program operation. The controller may monitor for an alarm signal from the memory dies on a first common channel between the controller and the memory dies. The alarm signal indicates that a corresponding memory die is entering an operational state that draws a peak current from the current source for the program operation. The controller can receive, from the memory dies, one or more alarm signals on the first common channel within a predetermined threshold time. The controller can transmit a postpone signal on a second common channel to the memory dies based on the one or more alarm signals received within the predetermined threshold time.

20 Claims, 18 Drawing Sheets

DUAL TIME DOMAIN CONTROL FOR DYNAMIC STAGGERING

BACKGROUND

Field

This disclosure is generally related to electronic devices and more particularly to storage devices.

INTRODUCTION

Storage devices enable users to store and retrieve data. Examples of storage devices include non-volatile memory devices. A non-volatile memory generally retains data after a power cycle. An example of a non-volatile memory is a flash memory, which may include array(s) of Not-And (NAND) flash memory cells on one or more dies. Flash memory may be found in solid-state devices (SSDs), Secure Digital (SD) cards, Universal Serial Bus (USB) cards, and the like.

A flash storage device may store control information associated with data. For example, a flash storage device may maintain control tables that include a mapping of logical addresses to physical addresses. This control tables are used to track the physical location of logical sectors, or blocks, in the flash memory. The control tables are stored in the non-volatile memory to enable access to the stored data after a power cycle.

When writing data to cells of the flash memory, the flash storage device may identify the physical address of a block associated with a logical address, and may then apply a program voltage to a word line of the block at the identified physical address to program the data into the cells coupled to that word line. Applying the program voltage to the word line may result in a current (Icc) which flows along a bit line coupled the cells and whose average and peak values may impact the life of the flash memory. For example, a small average Icc may result in more sustainable flash memories, and a small peak Icc may maintain voltages at reasonable levels in order to allow the flash storage device to function properly. As flash storage devices generally provide a fixed amount of power, a large peak Icc may cause voltages to drop to an extent affecting the device's functionality.

SUMMARY

Various embodiments are described herein for operating a nonvolatile memory, e.g., a NAND, a Bit Cost Scalable (BiCS) memory or the like. The memory can be operated to reduce the likelihood that a current draw in the system during operation of a memory device will exceed a maximum current. The memory controller can dynamically stagger the operation of the memory dies under certain detected operations to avoid synchronous operation of the memory dies, e.g., during a current intensive operational stages. This may operate to reduce the likelihood or prevent exceeding the maximum current value available to the group of memory times operably connected to the memory controller.

One aspect of a storage device is disclosed herein. The storage device includes a memory and a controller. The memory includes a plurality of memory dies, in which each of the plurality of memory dies draws a current from a current source during a program operation. The controller is coupled to the memory and configured to monitor for an alarm signal from one or more of the plurality of memory dies on a first common channel between the controller and the plurality of memory dies, the alarm signal indicating that a corresponding memory die of the plurality of memory dies is entering an operational state that draws a peak current from the current source for the program operation. The controller is further configured to receive, from the plurality of memory dies, one or more alarm signals on the first common channel within a predetermined threshold time. The controller is further configured to transmit a postpone signal on a second common channel to the plurality of memory dies based on the one or more alarm signals received within the predetermined threshold time.

Another aspect of a storage device is disclosed herein. The storage device includes a memory and a controller. The memory includes a plurality of memory dies. The controller is coupled to the memory and configured to monitor for an alarm signal from one or more of the plurality of memory dies on a first common channel between the controller and the plurality of memory dies. The controller is further configured to receive, from the plurality of memory dies, one or more alarm signals on the first common channel within a predetermined threshold time. The controller is further configured to transmit a postpone signal on a second common channel to the plurality of memory dies based on the one or more alarm signals received within the predetermined threshold time.

A further aspect of a storage device is disclosed herein. The storage device includes a plurality of memory dies and a controller. The plurality of memory dies is configured to draw a current from a current source during a program operation. The controller is coupled to the plurality of memory dies and configured to monitor for an alarm signal from one or more of the plurality of memory dies on a first common channel between the controller and the plurality of memory dies, the alarm signal indicating that a corresponding memory die of the plurality of memory dies is entering an operational state that draws a peak current from the current source for the program operation. The controller is further configured to receive, from the plurality of memory dies, one or more alarm signals on the first common channel within a predetermined threshold time. The controller is further configured to transmit a postpone signal on a second common channel to the plurality of memory dies based on the one or more alarm signals received within the predetermined threshold time.

It is understood that other aspects of the storage device will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present disclosure will now be presented in the detailed description by way of example, and not by way of limitation, with reference to the accompanying drawings, wherein.

DETAILED DESCRIPTION

Figure 1:
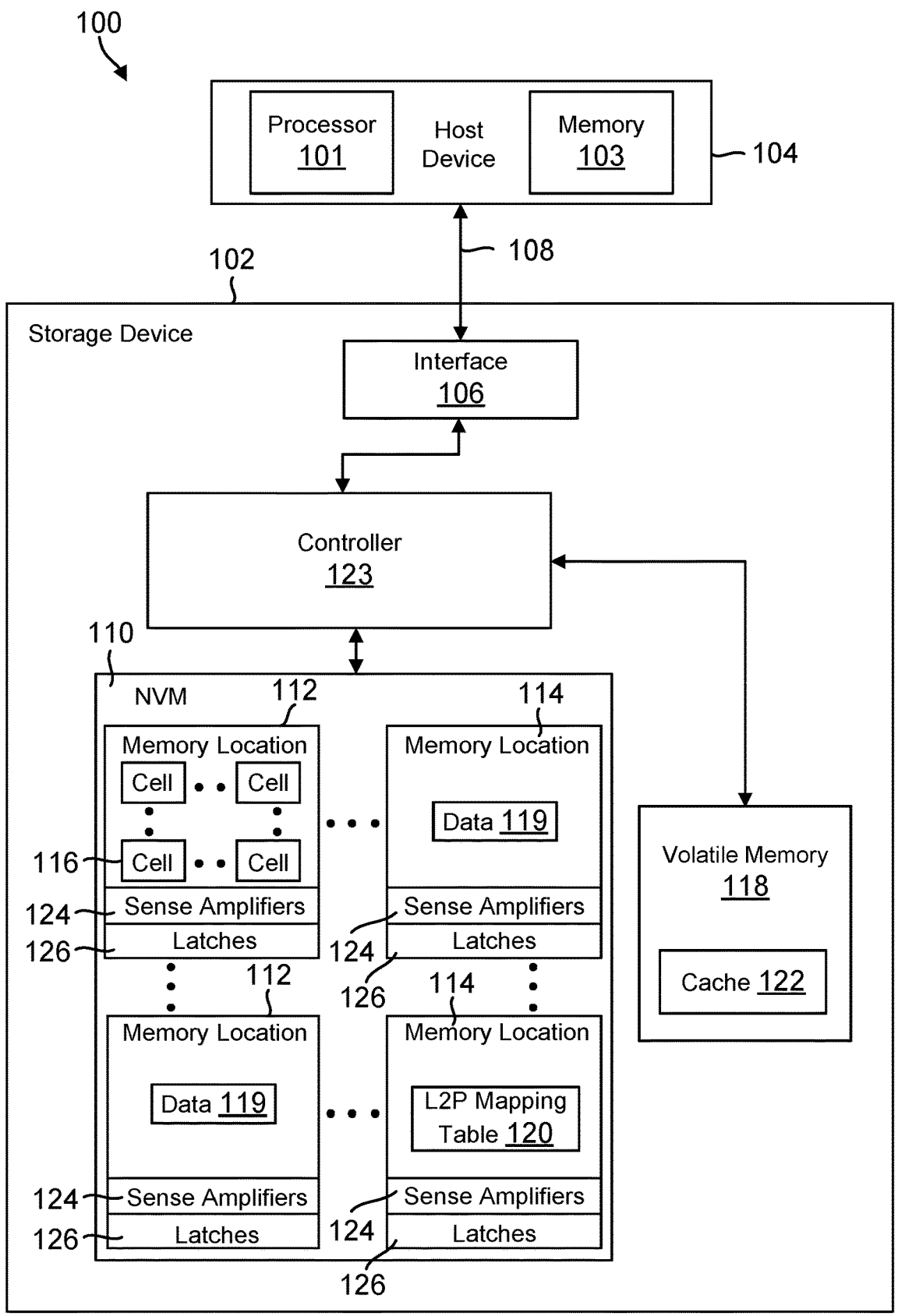
FIG. 1 is a block diagram illustrating an exemplary embodiment of a storage device in communication with a host device.

Apparatuses and techniques are described for controlling the program operations of memory dies to reduce the likelihood or prevent a current draw that exceeds a current supply capacity or maximum current draw from a current source. In an example, the memory dies are controlled by a same controller and draw current from a same current source. The current source can be part of the controller. The controller can issue a postpone signal to the memory dies to dynamically shift operation of one or more memory dies with a time delay such that a maximum current draw is not exceeded.

Each memory die may be configured to send an alarm signal to the controller when the memory die detects that it is about to enter an operational state that draws a peak current from the current source for a program operation (e.g., risky high peak CLK). The memory die can include one or more pin outputs to send the alarm signal. The controller can constantly monitor for the alarm signal and take action when it receives a large number of alarms from multiple memory dies. For example, the controller can postpone (or suspend) a memory die operation in response to receiving a certain number of alarm signals. In other examples, the controller may take no action in response to receiving the certain number of alarm signals. To receive an alarm signal and provide a postpone operation command to a memory die may require two trace pins on the controller for each memory die (e.g., a total of 16 pins on the controller for a bank of 8 memory dies). Typically, the memory dies are grouped to reduce the number of pins on the controller.

The present disclosure provides for a dual time domain control mechanism for dynamic die staggering to protect the memory dies from drawing high peak current. As briefly explained above, each memory die can be configured to send an alarm signal to the controller when the memory die detects that it is about to enter an operational state that draws a high peak current from the current source for a program operation. The controller starts a time counter after receiving a first alarm signal. If more alarm signals are received within a threshold amount of time since starting the time counter, then an alarm counter is increased for each received alarm signal. If the count of memory dies having issued alarm signals that overlap within a certain threshold time exceeds a maximum count, then the controller can broadcast a postpone signal to all the memory dies. When each memory die outputs an alarm signal, the memory die expects to receive a postpone signal from the controller within a certain timing window. If the memory die does not receive the postpone signal within the expected timing window, the memory die continues its ongoing storage operation. Otherwise, if the memory die receives the postpone signal within the expected timing window, then the memory die may postpone (or delay) its storage operation by a fixed duration and automatically resume its operation upon expiration of the fixed duration. In other aspects, the memory die may suspend its storage operation and may await for further instruction (e.g., a command sequence) from the controller to resume its suspended storage operation. In some aspects, the controller may include two dedicated pins (e.g., one pin for signal traffic from a memory die to the controller and other pin for signal traffic from the controller to the memory die) are provided to pass alarm signal and receive postpone signal.

The detailed description set forth below in connection with the appended drawings is intended as a description of various exemplary embodiments of the present disclosure and is not intended to represent the only embodiments in which the present disclosure may be practiced. The detailed description includes specific details for the purpose of providing a thorough understanding of the present disclosure. However, it will be apparent to those skilled in the art that the present disclosure may be practiced without these specific details. In some instances, well-known structures and components are shown in block diagram form in order to avoid obscuring the concepts of the present disclosure. Acronyms and other descriptive terminology may be used merely for convenience and clarity and are not intended to limit the scope of the disclosure.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the disclosure include the described components, structure, features, functionality, processes, advantages, benefits, or modes of operation.

As used herein, the term "coupled" is used to indicate either a direct connection between two components or, where appropriate, an indirect connection to one another through intervening or intermediate components. In contrast, when a component referred to as being "directly coupled" to another component, there are no intervening elements present.

In the following detailed description, various aspects of a storage device in communication with a host device will be presented. These aspects are well suited for flash storage devices, such as SSDs, USB and SD cards. However, those skilled in the art will realize that these aspects may be extended to all types of storage devices capable of storing data. Accordingly, any reference to a specific apparatus or method is intended only to illustrate the various aspects of the present disclosure, with the understanding that such aspects may have a wide range of applications without departing from the spirit and scope of the present disclosure.

FIG. 1 shows an exemplary block diagram 100 of a storage device 102 which communicates with a host device 104 (also "host") according to an exemplary embodiment. The host device 104 and the storage device 102 may form a system, such as a computer system (e.g., server, desktop, mobile/laptop, tablet, smartphone, etc.). The components of FIG. 1 may or may not be physically co-located. In this regard, the host device 104 may be located remotely from storage device 102. Although FIG. 1 illustrates that the host device 104 is shown separate from the storage device 102, the host device 104 in other embodiments may be integrated into the storage device 102, in whole or in part. Alternatively, the host device 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magneto-resistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host device 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host device 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra-Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies. Non-volatile Memory Express (NVMe) is a logical device interface specification for accessing non-volatile storage attached via a PCIe bus. NVMe takes advantage of parallelism offered by semiconductor memory such as, but not limited to, SSDs.

The storage device 102 includes a memory. For example, in the exemplary embodiment of FIG. 1, the storage device 102 may include a non-volatile memory (NVM) 110 for persistent storage of data received from the host device 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the exemplary embodiment of FIG. 1, each memory location 112 may be a die 114 including multiple planes each including multiple blocks of multiple cells 116. Alternatively, each memory location 112 may be a plane including multiple blocks of the cells 116. The cells 116 may be single-level cells, multi-level cells, triple-level cells, quad-level cells, and/or penta-level cells, for example. Other examples of memory locations 112 are possible; for instance, each memory location may be a block or group of blocks. Each memory location may include one or more blocks in a 3-D NAND array. Each memory location 112 may include one or more logical blocks which are mapped to one or more physical blocks. Alternatively, the memory and each memory location may be implemented in other ways known to those skilled in the art.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host device 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
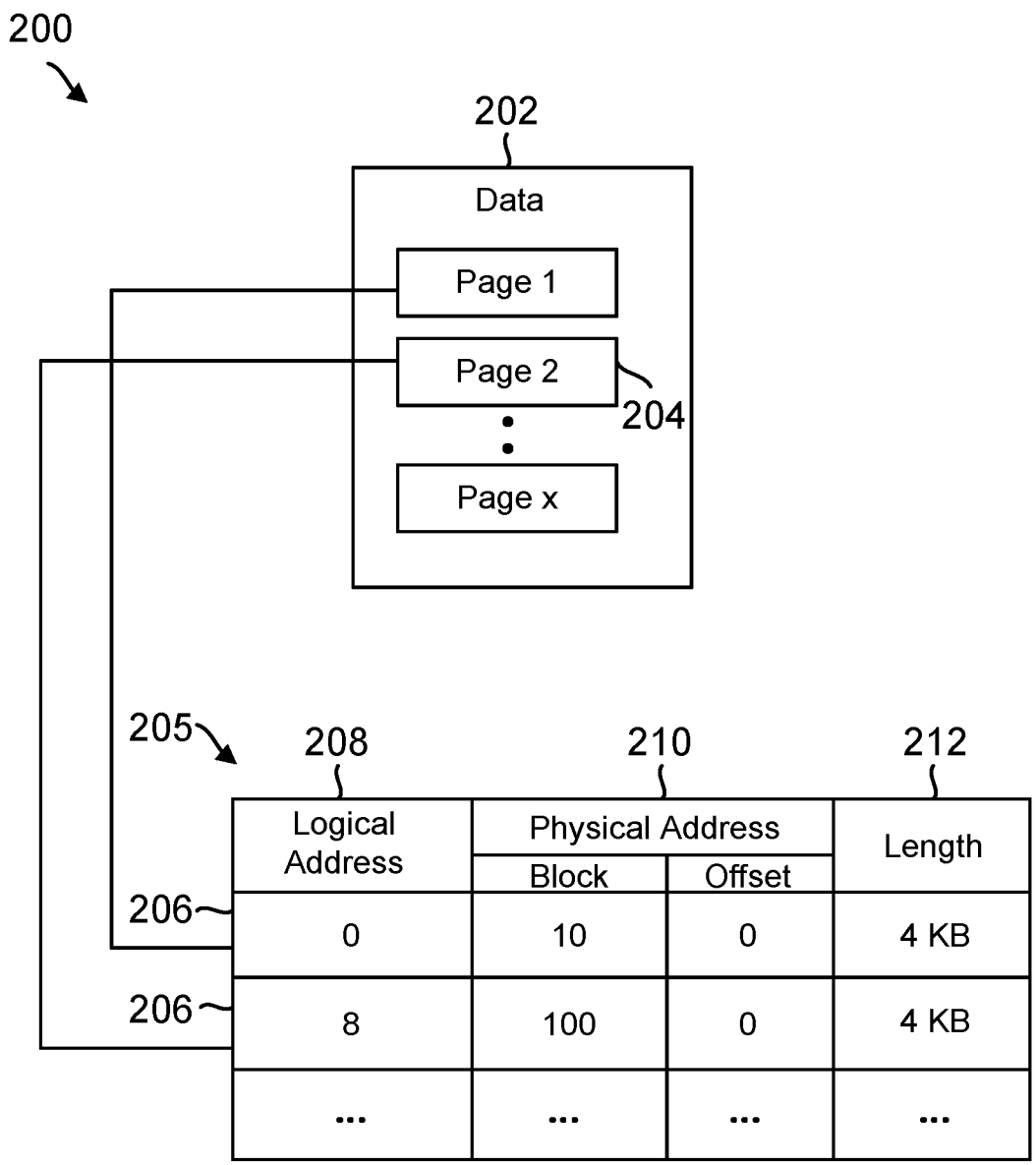
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host device 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an ASIC, a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The host interface 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host device 104 may retrieve data from the storage device 102 by sending a read command specifying one or more logical addresses associated with the data to be retrieved from the storage device 102, as well as a length of the data to be read. The host interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host device 104 via the host interface 106.

Figure 3:
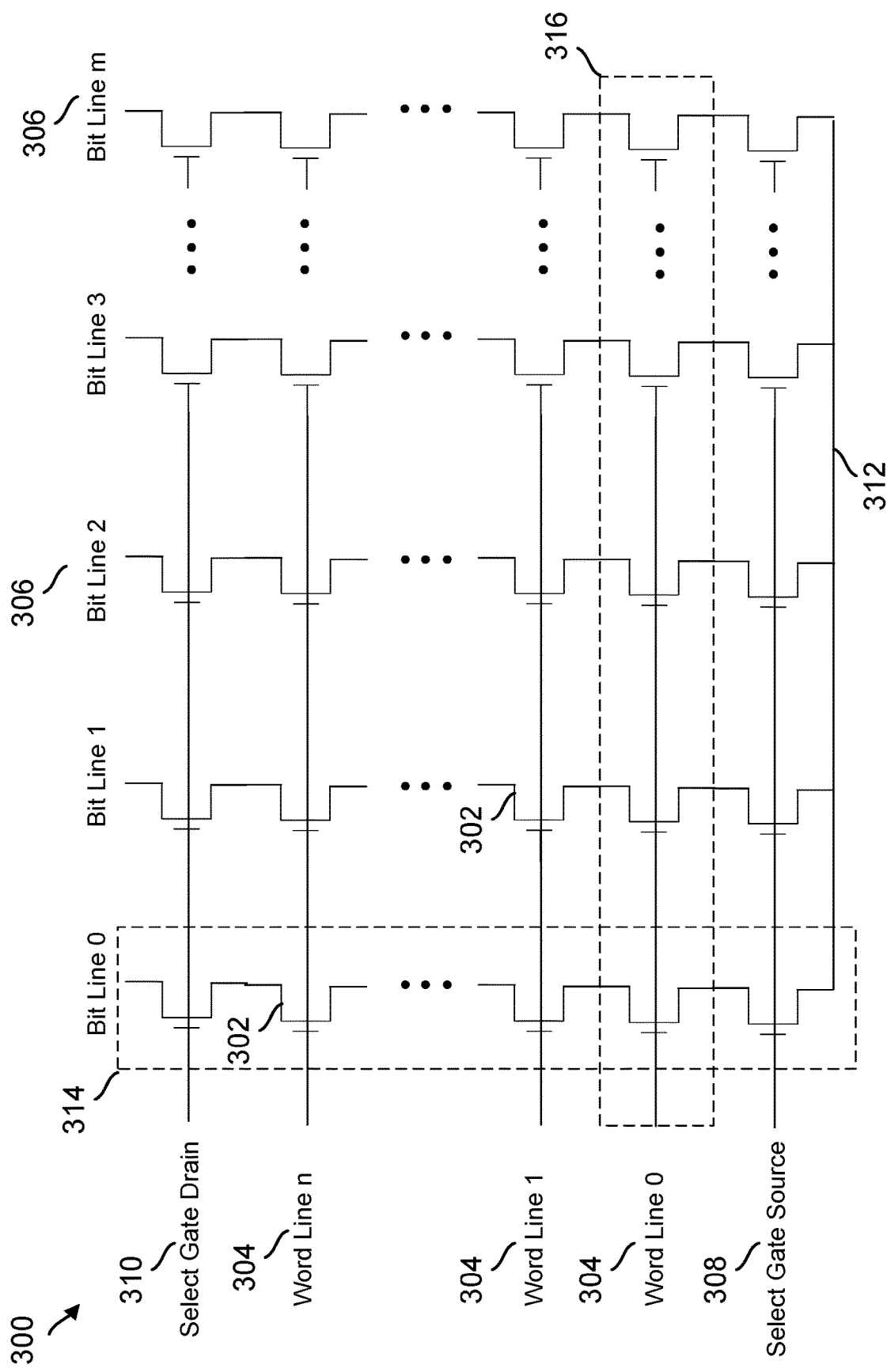
FIG. 3 is a conceptual diagram illustrating an example of an array of memory cells in the storage device of FIG. 1.

FIG. 3 illustrates an example of a NAND memory array 300 of cells 302. Cells 302 may correspond to cells 116 in the NVM 110 of FIG. 1. Multiple cells 302 are coupled to word lines 304 and bit lines 306. For example, the memory array 300 may include n word lines and m bit lines within a block of a die 114 of the NVM 110, where n and m are predefined according to the size of the block. Each word line and bit line may be respectively associated with a row and column address, which the controller 123 may use to select particular word lines and bit lines (e.g. using a row and column decoder). For example, word lines 0-n may each be associated with their own row address (e.g. word line 0 may correspond to word line address 0, word line 1 may correspond to word line address 1, etc.), and bit lines 0-m may each be associated with their own column address (e.g. bit line 0 may correspond to bit line address 0, bit line 1 may correspond to bit line address 1, etc.). Select gate source (SGS) cells 308 and select gate drain (SGD) cells 310 are coupled to the memory cells 302 on each bit line 306. The SGS cells 308 and SGD cells 310 connect the memory cells 302 to a source line 312 (e.g. ground) and bit lines 306, respectively. A string 314 may include a group of cells 302 (including SGS and SGD cells 308, 310) coupled to one bit line within a block, while a page 316 may include a group of cells 302 coupled to one word line within the block.

Figure 4:
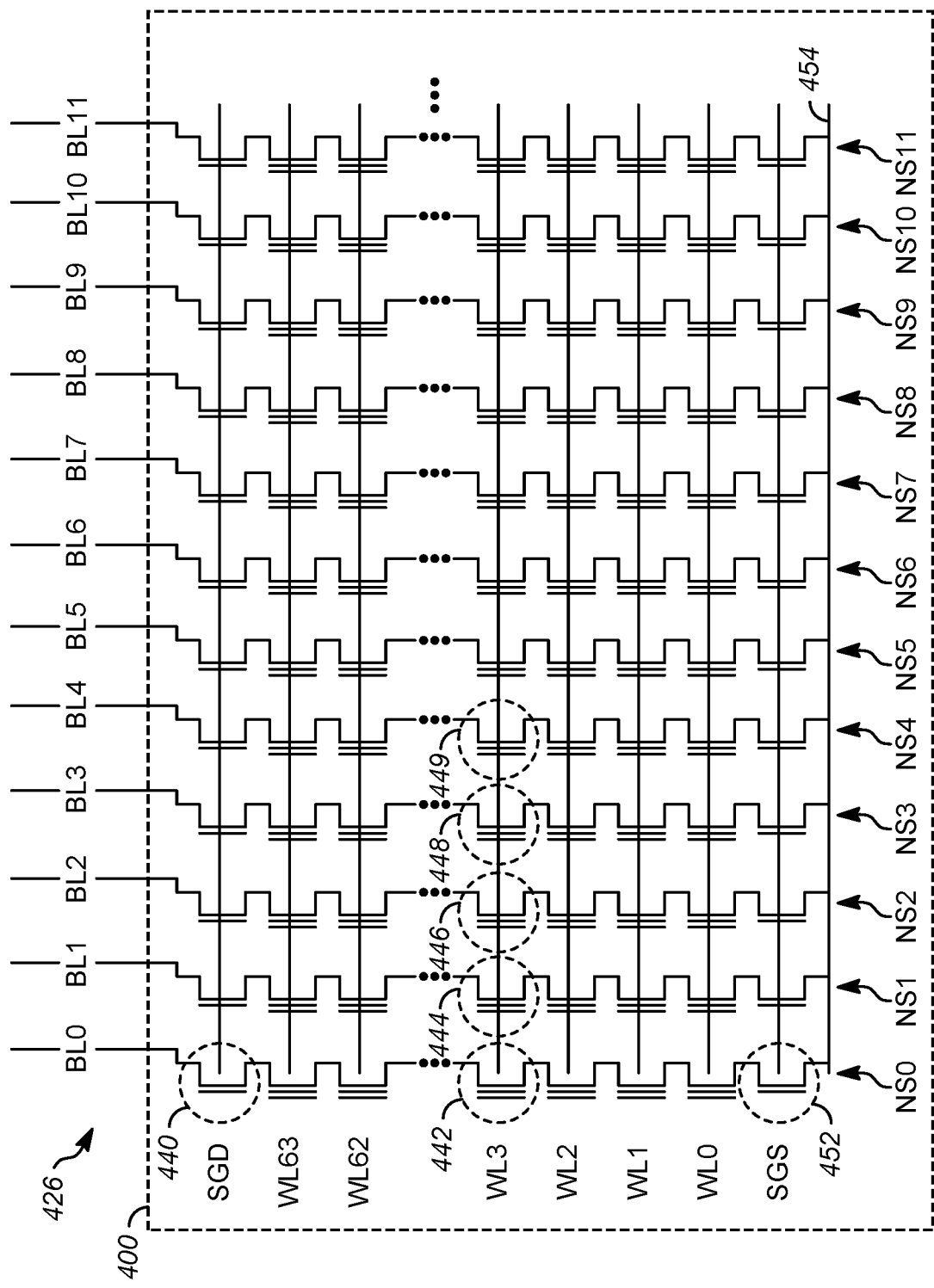
FIG. 4 illustrates an embodiment of an array of memory cells including bit and word lines according to an example embodiment.

FIG. 4 depicts an embodiment of memory arranged as NAND flash memory cells in a memory array 426. As used herein, the term "memory" denotes semiconductor memory. Types of semiconductor memory include volatile memory and non-volatile memory. Non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), spin-transfer torque magnetic random access memory (STT-RAM or STT-MRAM), resistive random access memory (e.g., ReRAM or RRAM) and phase change memory (e.g., PRAM or PCM). Non-volatile memory includes one or more memory cells. A "memory cell" is an electronic device or component capable of storing electronic information. In an embodiment, non-volatile memory utilizes floating-gate transistors or charge trap transistors as memory cells. The ability to adjust the threshold voltage of a floating-gate transistor or charge trap transistor allows the transistor to act as a non-volatile storage element or memory cell, such as a single-level cell (SLC). However, in some cases more than one data bit per memory cell (e.g., a multi-level cell) can be provided by programming and reading multiple threshold voltages or threshold voltage ranges, including a multi-level cell (MLC) (2 bits-per-cell), a triple level cell (TLC) (3 bits-per-cell), a quad-level cell (QLC) (4 bits-per-cell), and so forth.

The memory array 426 can include many blocks of memory. A "block of memory" is a set of memory cells. For example, a block of memory (e.g., an array of memory cells) includes memory cells arranged in word lines and bit lines. A "sub-block" of memory is a subset of a block of memory. For instance, a sub-block is a subset of memory cells corresponding to a subset of the word lines of a block of memory. In an embodiment, a sub-block includes fifty word lines in a block of memory, where the block of memory includes more than fifty-word lines. A sub block can denote a physical sub-block, a logical sub-block, or both. A block of memory includes two or more sub-blocks. In an embodiment, memory is structured as two-dimensional (2D) NAND. In another embodiment, memory is structured as three-dimensional (3D) NAND. In an embodiment, one or more of the components described herein (e.g., memory die, memory, block, sub-block, memory cells, circuits, controllers, and/or non-volatile storage systems) are implemented with one or more elements (e.g., transistors, resistors, capacitors, inductors, and/or conductors) in integrated circuitry.

An illustrative block of memory (or block) 400, as shown in FIG. 4, includes a number of NAND strings NS0 to NS11 and respective bit lines (e.g., BL0 to BL11, which are shared among the blocks). Each NAND string is connected at one end to a drain select gate (SGD), and the control gates of the drain select gates are connected via a common SGD line. Each NAND string is connected at its other end to a source select gate (SGS) which, in turn, is connected to a common source line 454. For example, NS0 includes a source side select gate transistor 452 and a drain side select gate transistor 440. Example storage elements 442, 444, 446, 448, and 449 are in NS0 to NS4, respectively, and are connected to a word line WL3. For example, WL3 could be a selected word line which is selected for programming and the example storage elements can be selected storage elements which are selected for programming Other storage elements connected to WL3 can also be selected storage elements. Sixty-four word lines, for example, WL0-WL63, extend between the source-side select gates and the drain-side select gates.

Other types of non-volatile memory in addition to NAND flash memory can also be used. For example, another type of memory cell useful in flash EEPROM systems utilizes a nonconductive dielectric material in place of a conductive floating gate to store charge in a nonvolatile manner In an embodiment, triple layer dielectric formed of silicon oxide, silicon nitride, and silicon oxide (ONO) is sandwiched between a conductive control gate and a surface of a semi-conductive substrate above the memory cell channel. The cell is programmed by injecting electrons from the cell channel into the nitride, where they are trapped and stored in a limited region. This stored charge then changes the voltage level of a portion of the channel of the cell in a manner that is detectable. The cell is erased by injecting hot holes into the nitride. A similar cell can be provided in a split-gate configuration where a doped poly silicon gate extends over a portion of the memory cell channel to form a separate select transistor. Another type of memory uses a metallic (conductive) charge storage element in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is obtained by separately reading binary states of the spatially separated charge storage regions within the dielectric. Other types of non-volatile memory are also known. In an alternative embodiment, resistance levels rather than threshold voltage levels can be stored and sensed.

Figure 5:
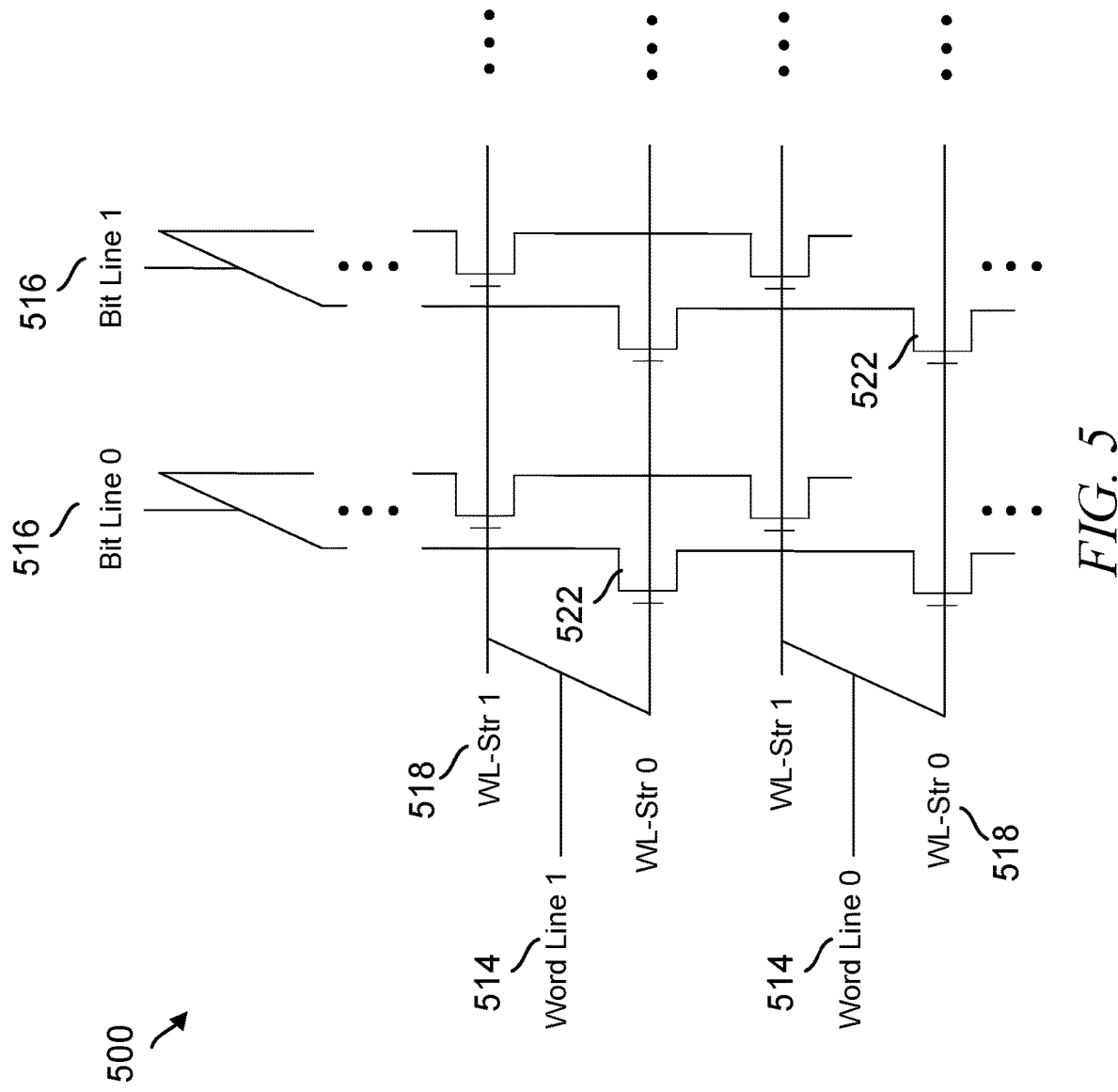
FIG. 5 is a conceptual diagram illustrating an example of a three-dimensional (3D) array of memory cells in the storage device of FIG. 1.

FIG. 5 illustrates an example of a three-dimensional (3D) NAND memory array 500 of cells 522. Cells 522 may correspond to cells 116 in the NVM 110 of FIG. 1. As in the 2D memory array 300 of FIG. 3, multiple cells 522 may be coupled to word lines 514 and bit lines 516. However, in the 3D memory array 500, the word lines 514 may each include multiple word line strings 518, and the bit lines 516 may be connected to each of the word line strings 518. Similarly, SGS cells and SGD cells (not shown) may respectively connect the memory cells in each word line string 518 to the source line (not shown) and bit lines 516. Thus, 3D memory array 500 may store more individually accessible pages of data on each word line 514 (e.g. in word line strings 518) than 2D memory array 300. While the 3D memory array 500 illustrated in FIG. 5 includes an example of two word line strings 518 for each word line 514, the word lines 514 may include other numbers of word line strings (e.g. four WL-Strs 0-3) in other examples. The architecture of FIG. 5, or variations thereof, may be used in 3D NAND implementations including BiCS flash memory for ultra-high density storage devices.

Figure 6:
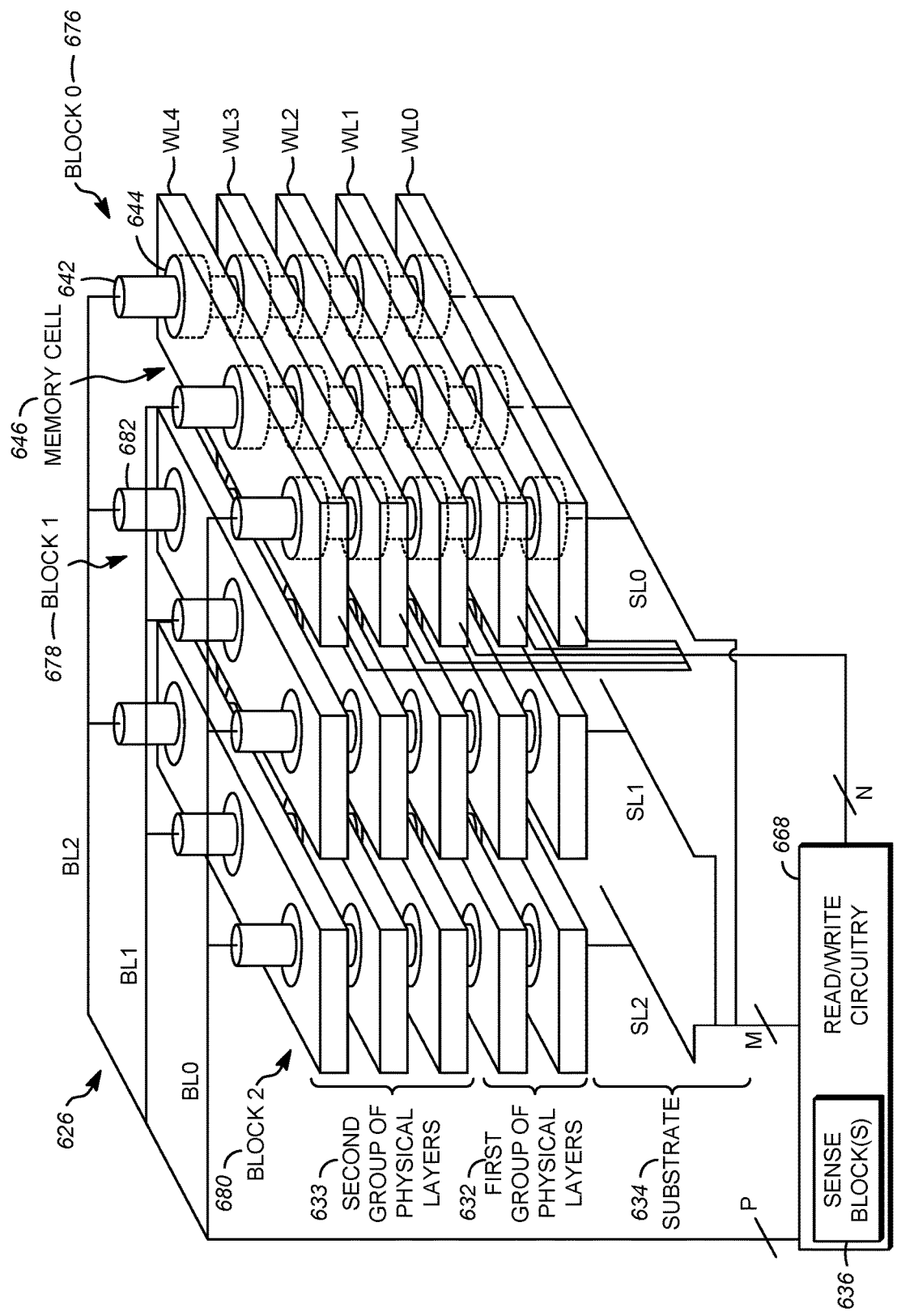
FIG. 6 illustrates a diagram of a 3D memory in a NAND configuration according to an example embodiment.

FIG. 6 illustrates an embodiment of 3D memory 626 in a NAND flash configuration. The 3D memory 626 includes multiple physical layers that are monolithically formed above a substrate 634, such as a silicon substrate. Storage elements (e.g., memory cells), such as a representative memory cell 646, are arranged in arrays in the physical layers.

The representative memory cell 646 includes a charge trap structure 644 between a word line/control gate WL4 and a conductive channel 642. Charge can be injected into or drained from the charge trap structure 644 via biasing of the conductive channel 642 relative to the word line WL4. For example, the charge trap structure 644 can include silicon nitride and can be separated from the word line WL4 and the conductive channel 642 by a gate dielectric, such as a silicon oxide. An amount of charge in the charge trap structure 644 affects an amount of current through the conductive channel 642 during a read operation of the memory cell 646 and indicates one or more bit values that are stored in the memory cell 646.

The 3D memory 626 includes multiple erase blocks, including a first block (block 0) 676, a second block (block 1) 678, and a third block (block 2) 680. Each block 676, 678, 680 includes a "vertical slice" of the physical layers that includes a stack of word lines, illustrated as a first word line WL0, a second word line WL1, a third word line WL2, a fourth word line WL3, and a fifth word line WL4. Multiple conductive channels (having a substantially vertical orientation, as shown in FIG. 6) extend through the stack of word lines. Each conductive channel is coupled to a storage element in each word line WL0-WL4, forming a NAND string of storage elements. FIG. 6 illustrates three blocks 676, 678, 680, five word lines WL0-WL4 in each block 676, 678, 680, and three conductive channels in each block 676, 678, 680 for clarity of illustration. However, the 3D memory 626 can have more than three blocks, more than five word lines per block, and more than three conductive channels per block.

Read/write circuitry 668 is coupled to the conductive channels via multiple conductive lines, illustrated as a first bit line BL0, a second bit line BL1, and a third bit line BL2 at a first end of the conductive channels (e.g., an end most remote from the substrate 634) and a first source line SL0, a second source line SL1, and a third source line SL2 at a second end of the conductive channels (e.g., an end nearer to or within the substrate 634). The read/write circuitry 668 is illustrated as coupled to the bit lines BL0-BL2 via "P" control lines, coupled to the source lines SL0-SL2 via "M" control lines, and coupled to the word lines WL0-WL4 via "N" control lines. Each of P, M, and N can have a positive integer value based on the specific configuration of the 3D memory 626. In the example shown in FIG. 6, P=3, M=3, and N=5.

Ina particular embodiment, each of the bit lines BL0-BL2 and each of the source lines SL0-SL2 can be coupled to the same end (e.g., the first end or the second end) of different conductive channels. For example, a particular bit line BL0-BL2 can be coupled to a first end of a conductive channel 682 and a particular source line can be coupled to a first end of the conductive channel 642. A second end of the conductive channel 682 can be coupled (e.g., electrically coupled) to a second end of the conductive channel 642. Accordingly, the conductive channel 682 and the conductive channel 642 can be coupled in series and can be coupled to the particular bit line BL0-BL2 and the particular source line SL0-SL2, each of which is coupled to a particular NAND string.

Although each of the conductive channels, such as the conductive channels 642, 682, is illustrated as a single conductive channel, each of the conductive channels can include multiple conductive channels that are in a stack configuration. The multiple conductive channels in a stacked configuration can be coupled by one or more connectors. Additionally, an etch stop layer (not illustrated in FIG. 6) having a conductive connector coupled to physically proximate portions of a conductive channel can be included in the multiple conductive channels, such as between the first group of physical layers 632 and the second group of physical layers 633. Additionally, or alternatively, one or more sub-block gate transistors (not illustrated in FIG. 6) can be coupled between the first group of physical layers 632 and the second group of physical layers 633.

In an embodiment, the first group of physical layers 632 is an example of a first sub-block and the second group of physical layers 633 is an example of a second sub-block. For example, each sub-block (e.g., "word line-based" sub-blocks) can include memory cells corresponding to a subset of word lines WL0-WL4. In an alternative embodiment, each sub-block (e.g., "string-based" sub-blocks) can include memory cells corresponding to a subset of strings (e.g., NAND strings), and can have, for example, common source lines SL0-SL2, but not common bit lines BL0-BL2 or vice versa.

The read/write circuitry 668 facilitates and/or effectuates read and write operations performed on the 3D memory 626. For example, data can be stored to storage elements coupled to a word line WL0-WL4 and the read/write circuitry 668 can read bit values from the storage elements (e.g., memory cells) using one or more sense blocks 636. As another example, the read/write circuitry 668 can apply selection signals to control lines coupled to the word lines WL0-WL4, the bit lines BL0-BL2, and the source lines SL0-SL2 to cause a programming voltage (e.g., a voltage pulse or series of voltage pulses) to be applied across selected storage element(s) of the selected word line (e.g., the fourth word line WL4).

The read/write circuitry 668 includes one or more sense blocks 636. The sense blocks 636 are utilized to read or sense one or more values stored in a memory cell. In one approach, one sense block 636 is provided for a group of NAND strings, each of which is coupled to a particular bit line BL0-BL2. For example, a sense block 636 is associated with BL0. Another sense block 636 is associated with BL1, and yet another sense block 636 is associated with BL2. Each sense block 636 can include a memory controller (not illustrated in FIG. 6). Each sense block 636 also includes a sense module for each NAND string. Alternatively, a sense block 636 can be coupled to an interval of bit lines, such as even or odd numbered bit lines.

During a read operation, a controller can receive a request from a host device, such as a computer, smartphone, or laptop computer. The controller can cause the read/write circuitry 668 to read bits from particular storage elements of the 3D memory 626 by applying appropriate signals to the control lines to cause storage elements of a selected word line to be sensed. Accordingly, the 3D memory 626 having multiple conductive channels in a stacked configuration can be configured to read from and write data to one or more storage elements.

One or more subblocks of memory cells 646 in an array of memory cells 646 can be coupled by a channel (e.g., a physical communication channel) In an embodiment, the channel comprises a bit line BL0-BL2 and/or a source line SL0-SL2.

Figure 7:
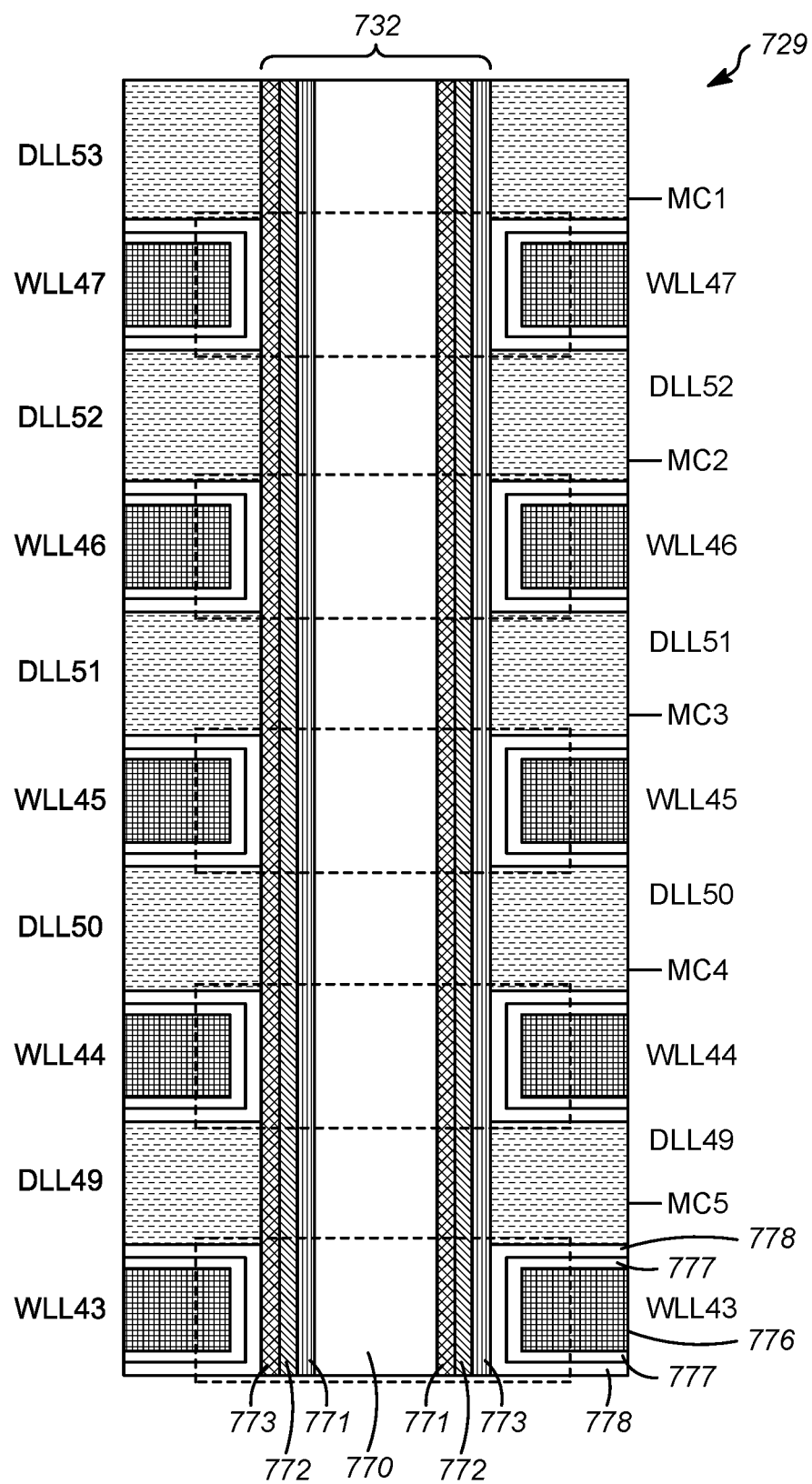
FIG. 7 illustrates a schematic block diagram illustrating an embodiment of a 3D vertical memory structure according to an example embodiment.

FIG. 7 illustrates one embodiment of a cross-sectional view of a 3D, vertical memory structure or string 729. In one embodiment, the vertical column 732 is round and includes four layers; however, in other embodiments more or less than four layers can be included, and other shapes can be used (e.g., a "U" shape instead of an "I" shape or the like). In one embodiment, a vertical column 732 includes an inner core layer 770 that is made of a dielectric, such as SiO2. Other materials can also be used. Surrounding the inner core or inner core layer 770 is a polysilicon channel 771. Materials other than polysilicon can also be used. Note that it is the channel 771 that connects to the bit line. Surrounding the channel 771 is a tunneling dielectric 772. In one embodiment, the tunneling dielectric 772 has an ONO structure. Surrounding the tunneling dielectric 772 is a shared charge-trapping layer 773, such as (for example) Silicon Nitride. Other materials and structures can also be used. The technology described herein is not limited to any particular material or structure.

FIG. 7 depicts dielectric layers DLL49, DLL50, DLL51, DLL52, and DLL53, as well as word line layers WLL43, WLL44, WLL45, WLL46, and WLL47. Each of the word line layers includes a word line region 776 surrounded by an aluminum oxide layer 777, which is surrounded by a blocking oxide (SiO2) layer 778. The physical interaction of the word line layers with the vertical column 732 forms the memory cells. Thus, a memory cell, in one embodiment, comprises the channel 771, tunneling dielectric 772, charge-trapping layer 773 (e.g., shared with other memory cells), blocking oxide layer 778, aluminum oxide layer 777, and the word line region 776. In some embodiments, the blocking oxide layer 778 and aluminum oxide layer 777 can be replaced by a single layer of material with insulating properties or by more than two layers of different material with insulating properties. Furthermore, the materials used are not limited to silicon dioxide (SiO2) or aluminum oxide. For example, word line layer WLL47 and a portion of vertical column 732 comprise a memory cell MC1. Word line layer WLL46 and a portion of vertical column 732 comprise a memory cell MC2. Word line layer WLL45 and a portion of vertical column 732 comprise a memory cell MC3. Word line layer WLL44 and a portion of vertical column 732 comprise a memory cell MC4. Word line layer WLL43 and a portion of vertical column 732 comprise a memory cell MC5. In other architectures, a memory cell can have a different structure, however, the memory cell would still be the storage unit.

When a memory cell is programmed, electrons are stored in a portion of the charge-trapping layer 773 that is associated with the memory cell. These electrons are drawn into the charge-trapping layer 773 from the channel 771, through the tunneling dielectric 772, in response to an appropriate voltage on the word line region 776. The threshold voltage (Vt) of a memory cell is increased in proportion to the amount of stored charge. In one embodiment, the programming is achieved through Fowler-Nordheim tunneling of the electrons into the charge-trapping layer. During an erase operation, the electrons return to the channel or holes are injected into the charge-trapping layer to recombine with electrons. In one embodiment, erasing is achieved using hole injection into the charge-trapping layer via a physical mechanism such as gate induced drain leakage (GIDL).

Storage cells in the same location or position in different memory structures 729 (e.g., different memory strings 729) on different bit lines, in certain embodiments, can be on the same word line. Each word line can store one page of data, such as when 1-bit of data is stored per cell (SLC); two pages of data, such as when 2-bits of data are stored per cell (MLC); three pages of data, such as when 7-bits of data are stored per cell (TLC); four pages of data, such as when 4-bits of data are stored per cell (QLC); or another number of pages of data.

In the depicted embodiment, a vertical, 7D memory structure 729 comprises an "1" shaped memory structure 729. In other embodiments, a vertical, 7D memory structure 729 can comprise a "U" shaped structure or can have another vertical and/or stacked architecture. In certain embodiments, four sets of strings 729 (e.g., four sets of 48 word lines, or another predefined number of word lines) can form an erase block, while in other embodiments, fewer or more than four sets of strings 729 can form an erase block. As can be appreciated, any suitable number of storage cells can be part of a single string 729. In one embodiment, a single string 729 includes 48 storage cells.

Figure 8:
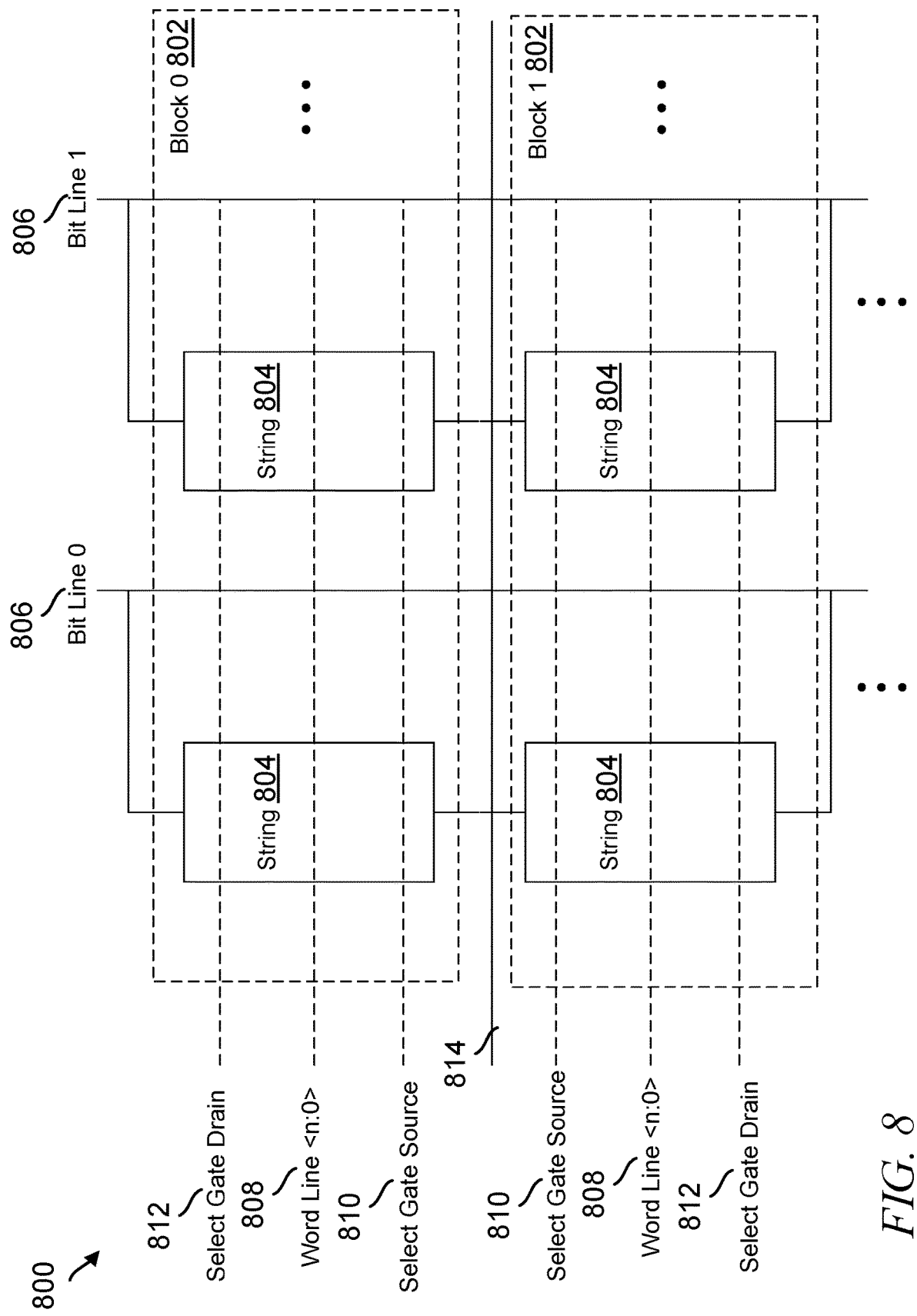
FIG. 8 is a conceptual diagram illustrating an example of an array of blocks in the storage device of FIG. 1.

FIG. 8 illustrates an example of a NAND memory array 800 of blocks 802 including multiple strings 804. Blocks 802 may correspond to blocks of a die 114 in the NVM 110 of FIG. 1, and strings 804 may each correspond to string 314 in FIG. 3. As in the memory array 300 of FIG. 3, each string 804 may include a group of memory cells each coupled to a bit line 806 and individually coupled to respective word lines 808. Similarly, each string may include a SGS cell 810 and SGD cell 812 which respectively connects the memory cells in each string 804 to a source line 814 and bit line 806.

When the controller 123 reads data from or writes data to a page 316 of cells 302 (i.e. on a word line 304, 808), the controller may send a command to apply a read voltage or program voltage to the selected word line and a pass through voltage to the other word lines. The read or programmed state of the cell (e.g. a logic '0' or a logic '1' for SLCs) may then be determined based on a threshold voltage of the cells 302. For example, during an SLC read operation, if the threshold voltage of a cell 302 is smaller than the read voltage (i.e. current flows through the cell in response to the read voltage), the controller 123 may determine that the cell stores a logic '1', while if the threshold voltage of the cell 302 is larger than the read voltage (i.e. current does not flow through the cell in response the read voltage), the controller 123 may determine that the cell stores a logic '0'. Similarly, during an SLC program operation, the controller may store a logic '0' by sending a command to apply the program voltage to the cell 302 on the word line 304, 808 until the cell reaches the threshold voltage, and during an erase operation, the controller may send a command to apply an erase voltage to the block 802 including the cells 302 (e.g. to a substrate of the cells such as a p-well) until the cells reduce back below the threshold voltage (back to logic '1').

For cells that store multiple bits (e.g. MLCs, TLCs, etc.), each word line 304, 808 may include multiple pages 316 of cells 302, and the controller may similarly send commands to apply read or program voltages to the word lines to determine the read or programmed state of the cells based on a threshold voltage of the cells. For instance, in the case of TLCs, each word line 304, 808 may include three pages 316, including a lower page (LP), a middle page (MP), and an upper page (UP), respectively corresponding to the different bits stored in the TLC. In one example, when programming TLCs, the LP may be programmed first, followed by the MP and then the UP. For example, a program voltage may be applied to the cell on the word line 304, 808 until the cell reaches a first intermediate threshold voltage corresponding to a least significant bit (LSB) of the cell. Next, the LP may be read to determine the first intermediate threshold voltage, and then a program voltage may be applied to the cell on the word line until the cell reaches a second intermediate threshold voltage corresponding to a next bit of the cell (between the LSB and the most significant bit (MSB)). Finally, the MP may be read to determine the second intermediate threshold voltage, and then a program voltage may be applied to the cell on the word line until the cell reaches the final threshold voltage corresponding to the MSB of the cell. Alternatively, in other examples, the LP, MP, and UP may be programmed together (e.g., in full sequence programming or Foggy-Fine programming), or the LP and MP may be programmed first, followed by the UP (e.g., LM-Foggy-Fine programming) Similarly, when reading TLCs, the controller 123 may read the LP to determine whether the LSB stores a logic 0 or 1 depending on the threshold voltage of the cell, the MP to determine whether the next bit stores a logic 0 or 1 depending on the threshold voltage of the cell, and the UP to determine whether the final bit stores a logic 0 or 1 depending on the threshold voltage of the cell.

Figure 9:
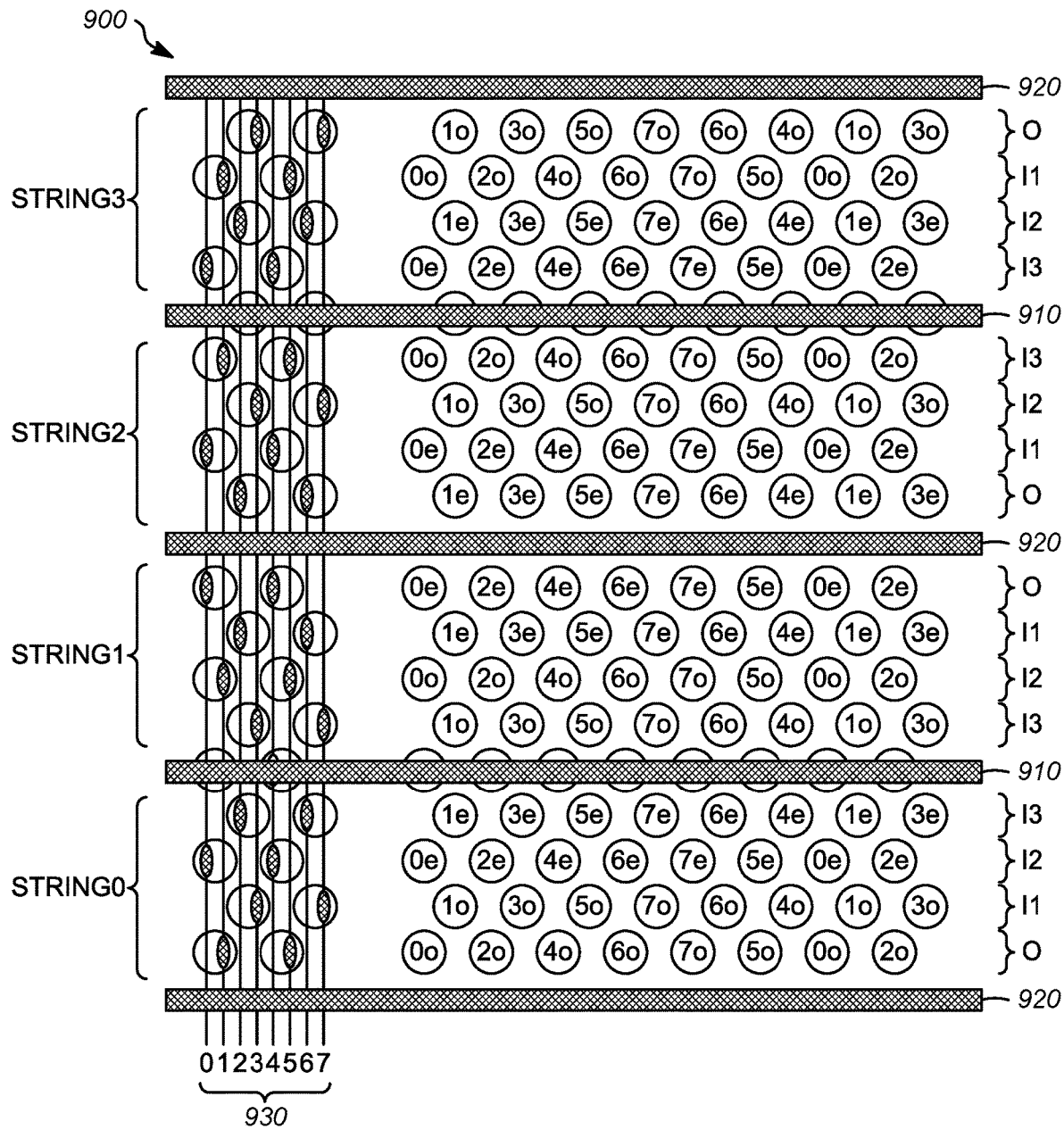
FIG. 9 illustrates a diagram showing a top view of a 3D memory block according to an example embodiment.

FIG. 9 is a diagram illustrating a top view of a 3D memory structure 900, according to one embodiment. As illustrated, the 3D memory structure 900 can comprise a series of memory holes or cells (represented by circles labeled "0o" to "7o" and "0e" to "7e" in FIG. 9). Each of these memory holes can be organized into strings (labeled as "String0" to "String3" in FIG. 9) and/or further organized into IO groups (labeled as "O," "I1," "I2," and "I3" in FIG. 9). Each IO group is located between two different types of etching features formed in the 3D memory structure 900, a shallow etching feature 910, and a deep etching feature 920. The IO groups adjacent to a deep etching feature 920 are labeled outer IO groups (O); the IO groups adjacent to a shallow etching feature 910 are labeled Inner3 IO groups (I3); the IO groups adjacent to the Outer IO groups are labeled Inner1 IO groups (I1); and the IO groups adjacent to the Inner3 IO groups (I3) are labeled Inner2 IO groups (I2). It should be noted that the procedures and methods disclosed herein can be implemented in connection with a wide variety of types of memory, such as NAND or NOR memory, 2D memory, 3D memory, or memory employing a charge-based or resistive-based storage technology. In one example, the illustrated memory structure 900 can include 16K memory cells, which can be further segregated into smaller groups of memory cells that include 1K memory cells each.

Some manufacturing processes for 3D memory can include film deposition processes that tend to dominate over etching processes performed during manufacturing. For these types of manufacturing processes, the outer memory holes in the Outer 10 groups (O) will generally program slower than the inner memory hole (I3). However, other manufacturing processes for 3D memory can include etching processes that tend to dominate over film deposition processes during manufacturing. For these types of manufacturing processes, the inner memory hole (I3) will generally program slower than the outer memory holes (O). It should be noted, however, that the physical position of an IO group of memory cells within the 3D memory structure is not always dispositive of its relative programming speed due to this variation introduced during the manufacturing process or as a result of wear induced by usage of the device. Moreover, cycling degradation can also cause the relative programming speed of different memory cells, or groups of memory cells, to shift over time.

Continuing with FIG. 9, each of the memory holes (0o-7o and 0e-7e) can be connected to bit lines 930 (labeled as bit lines 0-7 in FIG. 9). The bit lines 930 extend above the memory holes and are connected to select memory holes via connection points (illustrated as small, solid ovals in FIG. 9) indicating where a bit line 930 connects to a memory hole. For ease of illustration, only eight bit lines 930 (0 to 7) are shown in FIG. 9. However, it will be understood that other bit lines (not shown) also extend above the other memory holes in FIG. 9.

Figure 10:
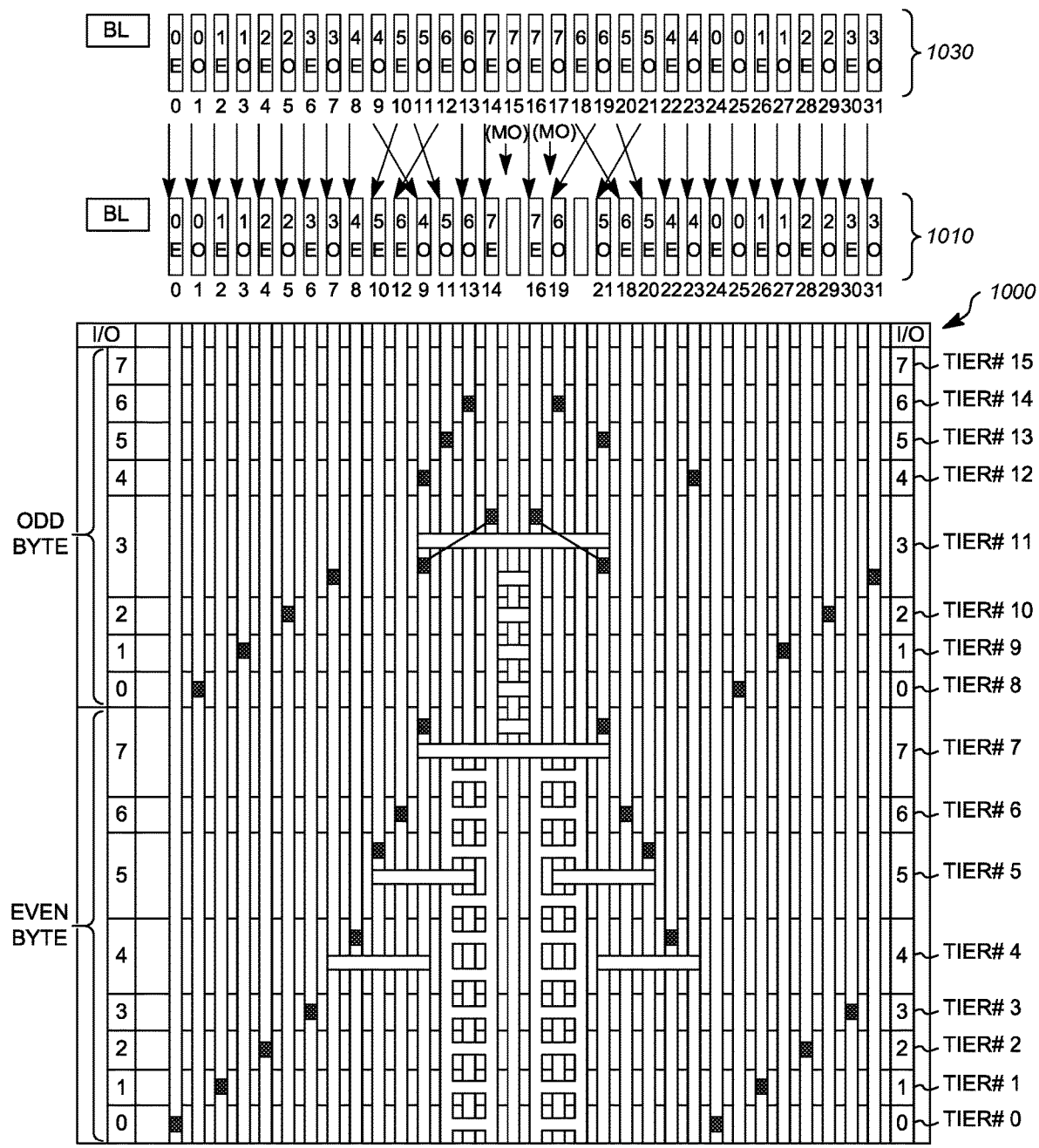
FIG. 10 illustrates an array of sense amplifier groups according to an exemplary embodiment for the 3D memory block of FIG. 9.

FIG. 10 illustrates an array of sense amplifier groups 1000 for the 3D memory structure 900 of FIG. 9, according to one example. The bit lines 930 shown in FIG. 9 extend to the array of sense amplifier groups 1000, as can be seen in FIG. 10. In this manner, certain memory holes of the 3D memory structure 900 can be electrically coupled to one of the bit lines 930, and each bit line can then be electrically coupled to a bit line interface 1010. In an embodiment, the bit line interface 1010 can additionally use scrambling, as illustrated by the angled/non-vertical lines shown in FIG. 10 between the bit lines 930 and the bit line interface 1010. Thereafter, each bit line 930 can be electrically coupled to a sense amplifier group (labeled as Tier #0 to Tier #15 in FIG. 10). As illustrated in FIG. 10, each sense amplifier group extends horizontally across the page. Accordingly, each "tier" comprises a group of memory holes in electrical communication with a particular sense amplifier group via a bit line 930. A tier can also be referred to as a "subgroup of memory cells," or just a "subgroup." A "subgroup" of memory cells can be any subset of memory cells formed from a larger group of memory cells. In this application, a subgroup of memory cells can be referred to as a tier, a tier group, an IO group, a division, and the like. Thus, while "subgroup of memory cells" is one term that may be used to refer to a subset of memory cells, any of these terms (i.e., "subgroup," "memory cell subgroup," "tier," "tier group," "IO group," "division," etc.) can be interchangeably used throughout the present disclosure.

Figure 11:
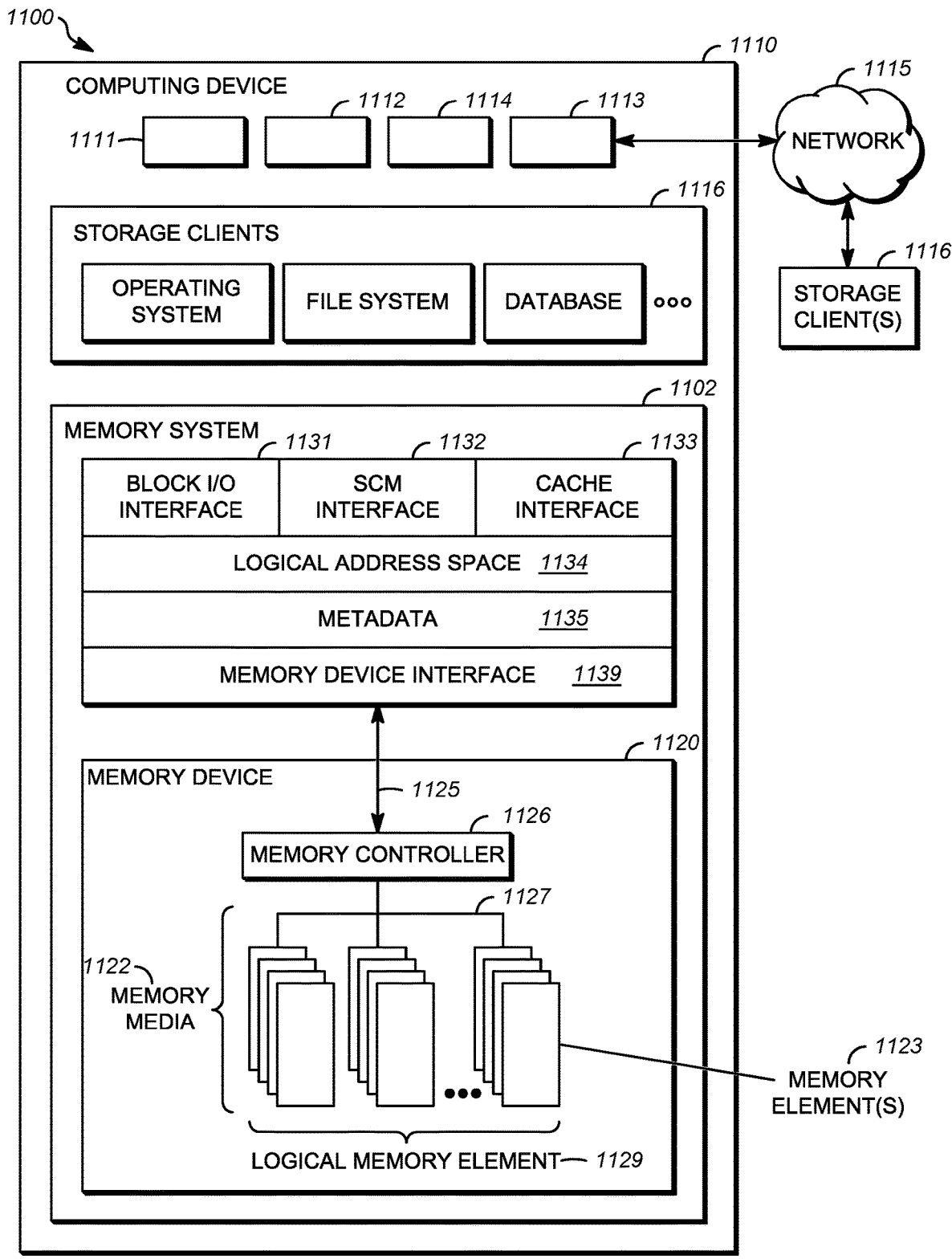
FIG. 11 illustrates a schematic block diagram illustrating an embodiment of a memory system and device utilizing dual time domain control for dynamic staggering according to an example embodiment.

FIG. 11 is a schematic block diagram illustrating an embodiment of a system 1100 and device 1110 using dual time domain control for dynamic staggering. In some embodiments, a memory device 1120 can at least partially operate on and/or in communication with a nonvolatile and/or volatile memory system 1102 of a computing device 1110, which can comprise a processor 1111, volatile memory 1112, and a communication interface 1113. The processor 1111 can comprise one or more central processing units, one or more general-purpose processors, one or more application-specific processors, one or more virtual processors (e.g., the computing device 1110 can be a virtual machine operating within a host), one or more processor cores, or the like. The communication interface 1113 can comprise one or more network interfaces configured to communicatively couple the computing device 1110 and/or memory controller 1126 to a communication network 1115, such as an Internet Protocol (IP) network, a Storage Area Network (SAN), wireless network, wired network, or the like.

The memory device 1120, in various embodiments, can be disposed in one or more different locations relative to the computing device 1110. In one embodiment, the memory device 1120 comprises one or more non-volatile and/or volatile memory elements 1123, such as semiconductor chips or packages or other integrated circuit devices disposed on one or more printed circuit boards, storage housings, and/or other mechanical and/or electrical support structures. For example, the memory device 1120 can comprise one or more direct inline memory module (DIMM) cards, one or more expansion cards and/or daughter cards, a memory card, a universal serial bus (USB) drive, a solid-state-drive (SSD) or other hard drive device, and/or can have another memory and/or storage form factor. The memory device 1120 can be integrated with and/or mounted on a motherboard of the computing device 1110, installed in a port and/or slot of the computing device 1110, installed on a different computing device 1110 and/or a dedicated storage appliance on the network 1115, in communication with the computing device 1110 over an external bus (e.g., an external hard drive), or the like.

The memory device 1120, in one embodiment, can be disposed on a memory bus of a processor 1111 (e.g., on the same memory bus as the volatile memory 1112, on a different memory bus from the volatile memory 1112, in place of the volatile memory 1112, or the like). In a further embodiment, the memory device 1120 can be disposed on a peripheral bus of the computing device 1110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the memory device 1120 can be disposed on a data network 1115, such as an Ethernet network, an Infiniband network, SCSI RDMA over a network 1115, a storage area network (SAN), a local area network (LAN), a wide area network (WAN) such as the Internet, another wired and/or wireless network 1115, or the like.

The computing device 1110 can further comprise a non-transitory, computer readable storage medium 1114. The computer readable storage medium 1114 can comprise executable instructions configured to cause the computing device 1110 (e.g., processor 1111) to perform steps of one or more of the methods disclosed herein.

According to various embodiments, a memory controller 1126 can manage one or more memory devices 1120 and/or memory elements 1123. The memory device(s) 1120 can comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 1120). Memory units and/or regions can include, but are not limited to: pages, memory divisions, blocks, sectors, collections or sets of physical storage locations (e.g., logical pages, logical blocks), or the like.

A device driver and/or the memory controller 1126, in certain embodiments, can present a logical address space 1134 to the storage clients 1116. As used herein, a logical address space 1134 refers to a logical representation of memory resources. The logical address space 1134 can comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an Mode, a Universally Unique Identifier (UUID), a Globally Unique Identifier (GUID), a hash code, a signature, an index entry, a range, an extent, or the like.

A device driver for the memory device 1120 can maintain metadata 1135, such as a logical to physical address mapping structure to map logical addresses of the logical address space 1134 to media storage locations on the memory device(s) 1120. A device driver can be configured to provide storage services to one or more storage clients 1116. The storage clients 1116 can include local storage clients 1116 operating on the computing device 1110 and/or remote storage clients 1116 accessible via the network 1115 and/or network interface 1113. The storage clients 1116 can include, but are not limited to: operating systems, file systems, database applications, server applications, kernel-level processes, user-level processes, applications, and the like.

A device driver can be communicatively coupled to one or more memory devices 1120. The one or more memory devices 1120 can include different types of memory devices including, but not limited to: solid-state storage devices, semiconductor storage devices, SAN storage resources, volatile memory devices, non-volatile memory devices, or the like. The one or more memory devices 1120 can comprise one or more respective memory media controllers 1126 and memory media 1122. A device driver can provide access to the one or more memory devices 1120 via a traditional block I/O interface 1131. Additionally, a device driver can provide access to enhanced functionality through the SCM interface 1132. The metadata 1135 can be used to manage and/or track data operations performed through any of the Block I/O interface 1131, SCM interface 1132, cache interface 1133, or other related interfaces.

The cache interface 1133 can expose cache-specific features accessible via a device driver for the memory device 1120. Also, in some embodiments, the SCM interface 1132 presented to the storage clients 1116 provides access to data transformations implemented by the one or more memory devices 1120 and/or the one or more memory media controllers 1126.

A device driver can present a logical address space 1134 to the storage clients 1116 through one or more interfaces. As discussed above, the logical address space 1134 can comprise a plurality of logical addresses, each corresponding to respective media locations on one or more memory devices 1120. A device driver can maintain metadata 1135 comprising any-to-any mappings between logical addresses and media locations, or the like.

A device driver can further comprise and/or be in communication with a memory device interface 1139 configured to transfer data, commands, and/or queries to the one or more memory devices 1120 over a bus 1125, which can include, but is not limited to: a memory bus of a processor 1111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 1115, Infiniband, SCSI RDMA, or the like. The memory device interface 1139 can communicate with the one or more memory devices 1120 using input-output control (IO-CTL) command(s), IO-CTL command extension(s), remote direct memory access, or the like.

The communication interface 1113 can comprise one or more network interfaces configured to communicatively couple the computing device 1110 and/or the memory controller 1126 to a network 1115 and/or to one or more remote, network-accessible storage clients 1116. The storage clients 1116 can include local storage clients 1116 operating on the computing device 1110 and/or remote storage clients 1116 accessible via the network 1115 and/or the network interface 1113. The memory controller 1126 is part of and/or in communication with one or more memory devices 1120. Although FIG. 11 depicts a single memory device 1120, the disclosure is not limited in this regard and could be adapted to incorporate any number of memory devices 1120, a combination of one or more volatile memory devices 1120 and one or more non-volatile memory devices 1120, or the like.

The memory device 1120 can comprise one or more elements 1123 of memory media 1122. In one embodiment, an element 1123 of memory media 1122 comprises a volatile memory medium 1122, such as random-access memory (RAM), dynamic RAM (DRAM), synchronous DRAM (SDRAM), double data rate (DDR) SDRAM, static RAM (SRAM), thyristor RAM (T-RAM), zero-capacitor RAM (Z-RAM), or the like. In certain embodiments, an element 1123 of memory media 1122 comprises a non-volatile memory medium 1122, such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS) memory, programmable metallization cell (PMC) memory, conductive-bridging RAM (CBRAM), magneto-resistive RAM (MRAM), magnetic storage media (e.g., hard disk, tape), optical storage media, or the like. Thus, the memory device 1120 may rely, for example, on stored voltage levels or stored resistance levels. The one or more memory elements 1123 of memory media 1122, in certain embodiments, comprise storage class memory (SCM).

While legacy technologies such as NAND flash can be block and/or page addressable, storage class memory, in one embodiment, is byte addressable. In further embodiments, storage class memory can be faster and/or have a longer life (e.g., endurance) than NAND flash; can have a lower cost, use less power, and/or have a higher storage density than DRAM; or offer one or more other benefits or improvements when compared to other technologies. For example, storage class memory can comprise one or more non-volatile memory elements 1123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 1122 is referred to herein as "memory media," in various embodiments, the non-volatile memory media 1122 can more generally comprise one or more non-volatile recording media capable of recording data, which can be referred to as a non-volatile memory medium, a non-volatile storage medium, or the like. Further, the nonvolatile memory device 1120, in various embodiments, can comprise a non-volatile recording device, a non-volatile memory device, a non-volatile storage device, or the like. Similarly, a nonvolatile memory element 1123, in various embodiments, can comprise a non-volatile recording element, a non-volatile memory element, a non-volatile storage element, or the like.

The non-volatile memory media 1122 can comprise one or more non-volatile memory elements 1123, which can include, but are not limited to: chips, packages, planes, die, or the like. A non-volatile memory controller 1126 can be configured to manage data operations on the nonvolatile memory media 1122, and can comprise one or more processors, programmable processors (e.g., FPGAs), ASICs, micro-controllers, or the like. In some embodiments, the nonvolatile memory controller 1126 is configured to store data on and/or read data from the nonvolatile memory media 1122, to transfer data to/from the non-volatile memory device 1120, and so on.

The non-volatile memory controller 1126 can be communicatively coupled to the non-volatile memory media 1122 by way of a bus 1127. The bus 1127 can comprise an I/O bus for communicating data to/from the non-volatile memory elements 1123. The bus 1127 can further comprise a control bus for communicating addressing, and other command and control information to the non-volatile memory elements 1123. In some embodiments, the bus 1127 can communicatively couple the non-volatile memory elements 1123 to the non-volatile memory controller 1126 in parallel. This parallel access can allow the non-volatile memory elements 1123 to be managed as a group, forming a logical memory element 1129. The logical memory element can be partitioned into respective logical memory units (e.g., logical pages) and/or logical memory divisions (e.g., logical blocks). The logical memory units can be formed by logically combining physical memory units of each of the non-volatile memory elements.

The non-volatile memory controller 1126 can comprise and/or be in communication with a device driver executing on the computing device 1110. A device driver can provide storage services to the storage clients 1116 via one or more interfaces 1131, 1132, and/or 1133. In some embodiments, a device driver provides a block-device I/O interface 1131 through which storage clients 1116 perform block-level I/O operations. Alternatively, or in addition, a device driver can provide a storage class memory (SCM) interface 1132, which can provide other storage services to the storage clients 1116. In some embodiments, the SCM interface 1132 can comprise extensions to the block device interface 1131 (e.g., storage clients 1116 can access the SCM interface 1132 through extensions or additions to the block device interface 1131). Alternatively, or in addition, the SCM interface 1132 can be provided as a separate API, service, and/or library. A device driver can be further configured to provide a cache interface 1133 for caching data using the non-volatile memory system 1102. A device driver can further comprise a non-volatile memory device interface 1139 that is configured to transfer data, commands, and/or queries to the non-volatile memory controller 1126 over a bus 1125, as described above.

Figure 12:
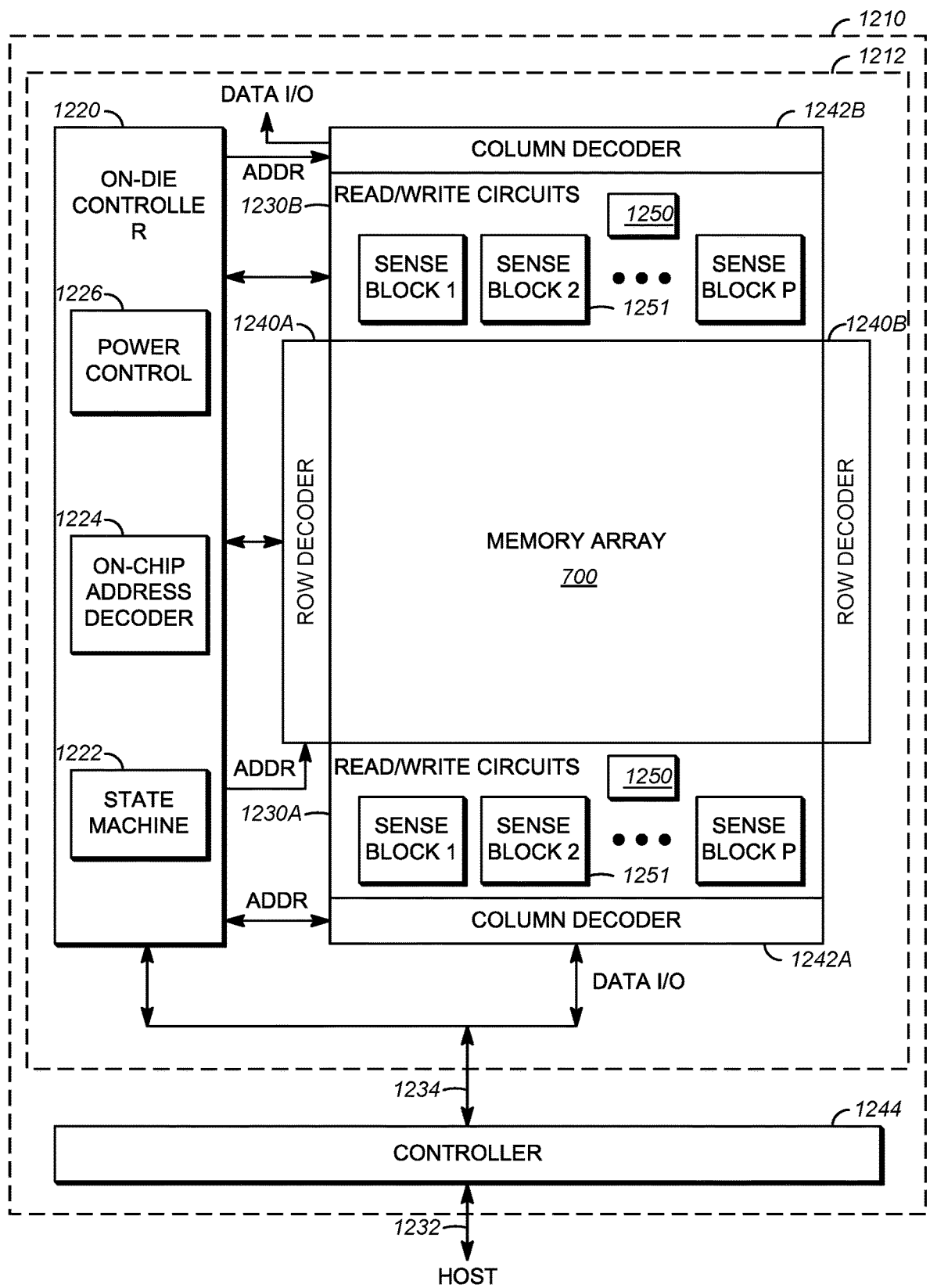
FIG. 12 illustrates a schematic block diagram of non-volatile storage device for dual time domain control for dynamic staggering.

FIG. 12 is a schematic block diagram illustrating an embodiment of a non-volatile storage device 1210 for dual time domain control for dynamic staggering. The non-volatile storage device 1210 can include one or more memory die or chips 1212. A "memory die" includes a block of semiconducting material on which a memory circuit is fabricated and, as used herein, also includes the memory circuit disposed thereon. The nonvolatile storage device 1210 can be substantially similar to the computing device 1110 described with reference to FIG. 11.

The memory die 1212, in some embodiments, includes an array 1200 (e.g., two-dimensional or three dimensional) of memory cells, an on-die controller 1220, and read/write circuits 1230A/1230B. In one embodiment, access to the memory array 1200 by the various peripheral circuits is implemented in a symmetric fashion, on opposite sides of the memory array 1200, so that the densities of access lines and circuitry on each side are reduced by half. The read/write circuits 1230A/1230B, in a further embodiment, include multiple sense blocks 1251 which allow a page of memory cells to be read or programmed in parallel.

The memory array 1200, in various embodiments, is addressable by word lines via row decoder circuits 1240A/1240B and by bit lines via column decoder circuits 1242A/1242B. In some embodiments, a controller 1244 is included in the same memory device 1210 (e.g., a removable storage card or package) as the one or more memory die 1212. Commands and data are transferred between the host and controller 1244 via lines 1232 and between the controller and the one or more memory die 1212 via lines 1234. One implementation can include multiple chips 1212.

On-die controller 1220, in one embodiment, cooperates with the read/write circuits 1230A/1230B to perform memory operations on the memory array 1200. The on-die controller 1220, in certain embodiments, includes a state machine 1222, an on-chip address decoder 1224, and a power control circuit 1226. In one embodiment, the on-chip address decoder 1224 and/or the power control circuit 1226 can be part of and/or controlled by the controller 1244.

The state machine 1222, in one embodiment, provides chip-level control of memory operations. The on-chip address decoder 1224 provides an address interface to convert between the address that is used by the host or a memory controller to the hardware address used by the decoder circuits 1240A, 1240B, 1242A, 1242B. The power control circuit 1226 controls the power and voltages supplied to the word lines and bit lines during memory operations. In one embodiment, the power control circuit 1226 includes one or more charge pumps that can create voltages larger than the supply voltage.

In an embodiment, one or any combination of the on-die controller 1220, state machine 1222, power control circuit 1226, on-chip address decoder 1224, decoder circuit 1242 A, decoder circuit 1242B, decoder circuit 1240 A, decoder circuit 1240B, read/write circuits 1230 A, read/write circuits 1230B, and/or controller 1244 can be referred to as one or more managing circuits.

Figure 13:
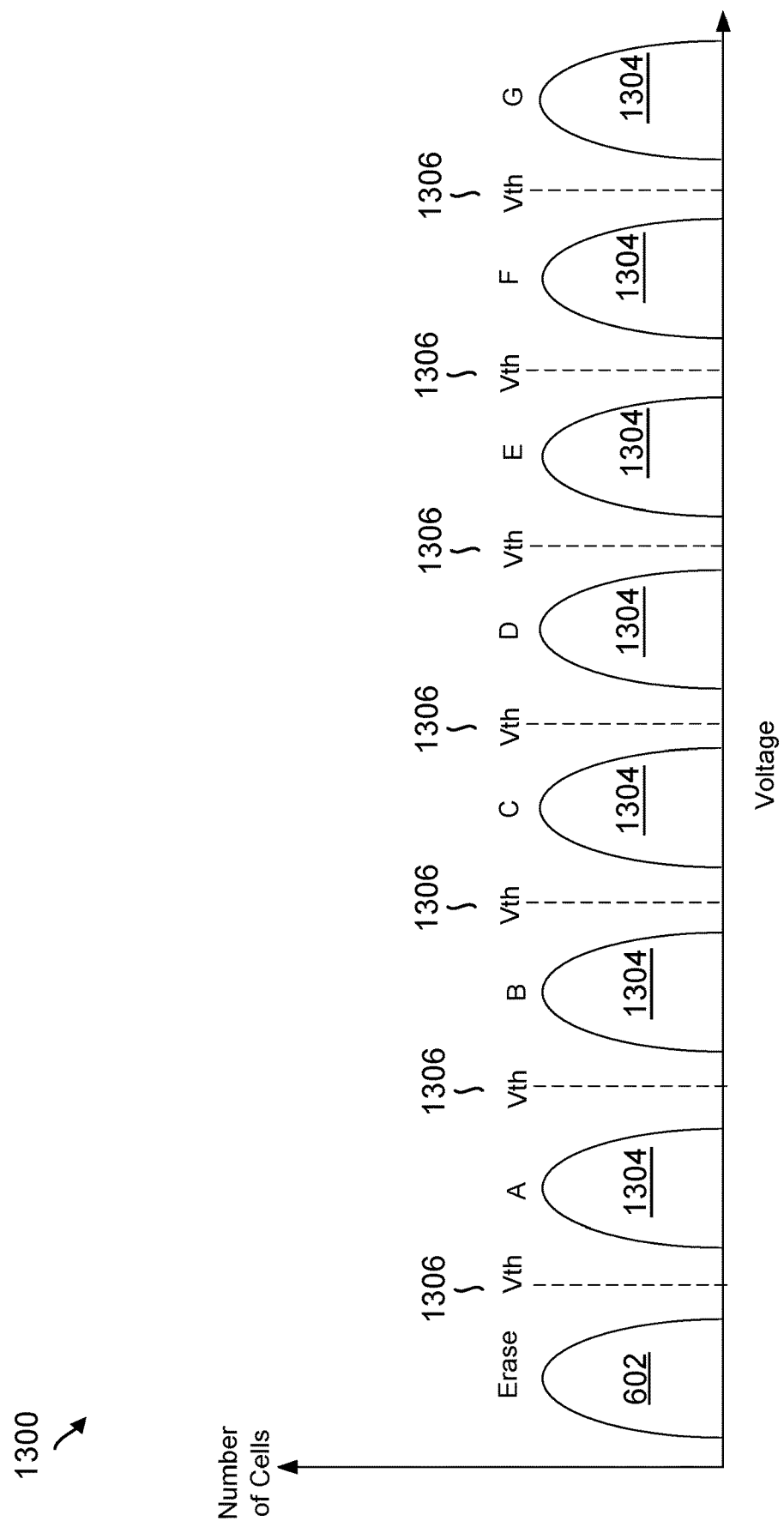
FIG. 13 is a graphical diagram illustrating an example of a voltage distribution chart for triple-level cells in the storage device of FIG. 1.

FIG. 13 illustrates an example of a voltage distribution chart 1300 illustrating different NAND states for TLCs (e.g. cells 116, 302) storing three bits of data (e.g. logic 000, 001, etc. up to logic 111). The TLCs may include an erase state 1302 corresponding to logic '111' and multiple program states 1304 (e.g. A-G) corresponding to other logic values '000-110'. The program states 1304 may be separated by different threshold voltages 1306. Initially, the cells 116, 302 may be in the erase state 1302, e.g. after the controller 123 erases a block 802 including the cells. When the controller 123 program LPs, MPs, and UPs as described above, the voltages of the cells 116, 302 may be increased until the threshold voltages 1306 corresponding to the logic values to be stored are met, at which point the cells transition to their respective program states 1304. While FIG. 13 illustrates eight NAND states for TLCs, the number of states may be different depending on the amount of data that is stored in each cell 116, 302. For example, SLCs may have two states (e.g. logic 0 and logic 1), MLCs may have four states (e.g. logic 00, 01, 10, 11), and QLCs may have sixteen states (e.g. erase and A-N).

When the controller 123 attempts to program cells 116, 302 of a selected word line 304, 808 into one of the program states 1304, the controller may perform incremental step pulse programming (ISPP) over a number of programming loops or ISPP cycles. For example, a programming voltage (e.g. a high voltage) may be applied to the selected word line 304, 808, a pass through voltage (e.g. a high voltage lower than the programming voltage) may be applied to the other word lines 304, 808, a bit line program voltage (e.g. a low voltage) may be applied on the bit lines 306, 806 connected to the selected cells being programmed on the selected word line, and a bit line inhibit voltage (e.g. a high voltage) may be applied on the bit lines 306, 806 connected to the other cells not being programmed on the selected word line. Applying a high programming voltage to the selected word line and a low voltage to the selected bit lines allows electrons to tunnel from the channel into the charge trapping layer of those selected cells, thereby causing the threshold voltage of the cells to increase. On the other hand, applying a high voltage to unselected bit lines inhibits electrons from tunneling from the channel into the charge trapping layer of those unselected cells, thereby preventing the threshold voltage of those cells from increasing. Thus, bit lines coupled to cells programmed to lower states may be inhibited to prevent the threshold voltage of those cells from increasing while other cells are programmed to higher states. For instance, in the case of TLCs, the bit lines of cells that are first programmed into the A state may be inhibited first, followed by the bit lines of different cells that are programmed into the B state, followed by those that reach the C state, then the D state, and so forth until the remaining cells on the selected word line ultimately reach the G state and all cells on the selected word line have been programmed.

After the programming voltage is applied in one programming loop or ISPP cycle, a program verify voltage (e.g. a low voltage) may be applied to the word line 304, 808 to determine whether the threshold voltage of a cell has increased beyond a respective threshold voltage into an intended program state. If none of the cells have transitioned into an intended programming state, then another programming loop or ISPP cycle is performed in which a higher programming voltage may be applied to further increase the threshold voltage of the cells. Subsequently, a program verify voltage may again be applied to determine whether the threshold voltage of a cell has transitioned into an intended program state. The above process of incrementally increasing the programming voltage and verifying the voltage threshold of the selected cells may be repeated over a number of programming loops. If the cells transition into their respective programming states and the total number of programming loops does not exceed a predetermined loop count, the controller may determine that the cells have entered their intended program states and are thus successfully programmed. Otherwise, if the total number of programming loops exceeds the predetermined loop count before the cells transition into their respective programming states, the controller may determine that a program failure has occurred.

Figure 14A:
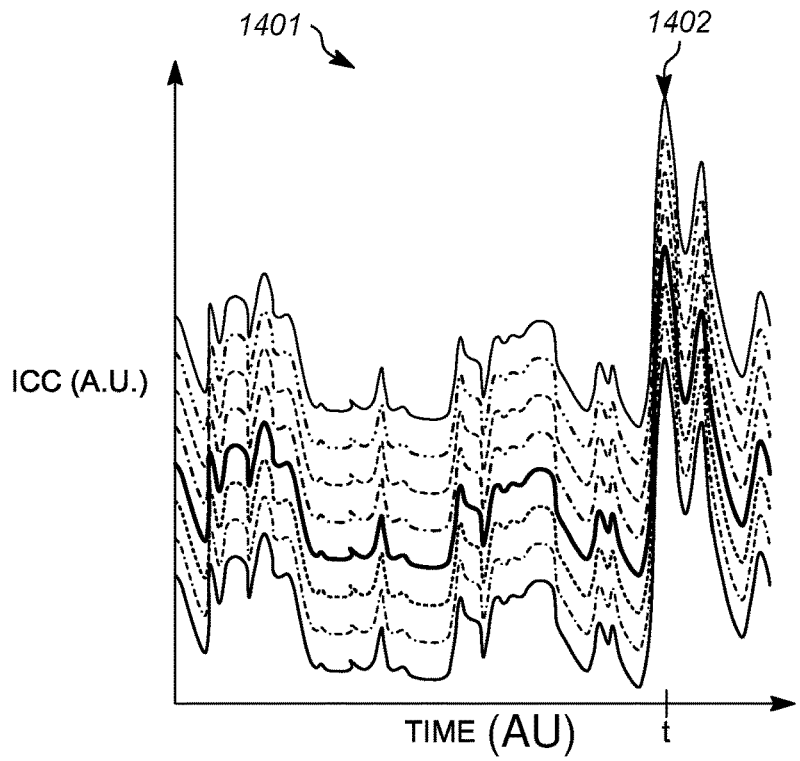
FIG. 14A depicts a timing diagram of current draw for a non-modified operation of a plurality of memory dies.

FIG. 14A shows a graph 1401 with the Icc current on a multi-memory die system as a function of time. There is no counter measure to prevent excess current draw for this group of memory dies, which can share a same host or memory controller. At 1402, each of the memory dies draws a peak current Icc at time t. During a programming operation this can be at the P5 operation. This standard operation of the memory system with eight memory dies would require more current than could be supplied to the eight memory dies from the memory controller of the system. The peak Icc is an issue for this default operation as discussed herein due to the peaks occurring at the same time domain. This may result in memory storage errors.

Figure 14B:
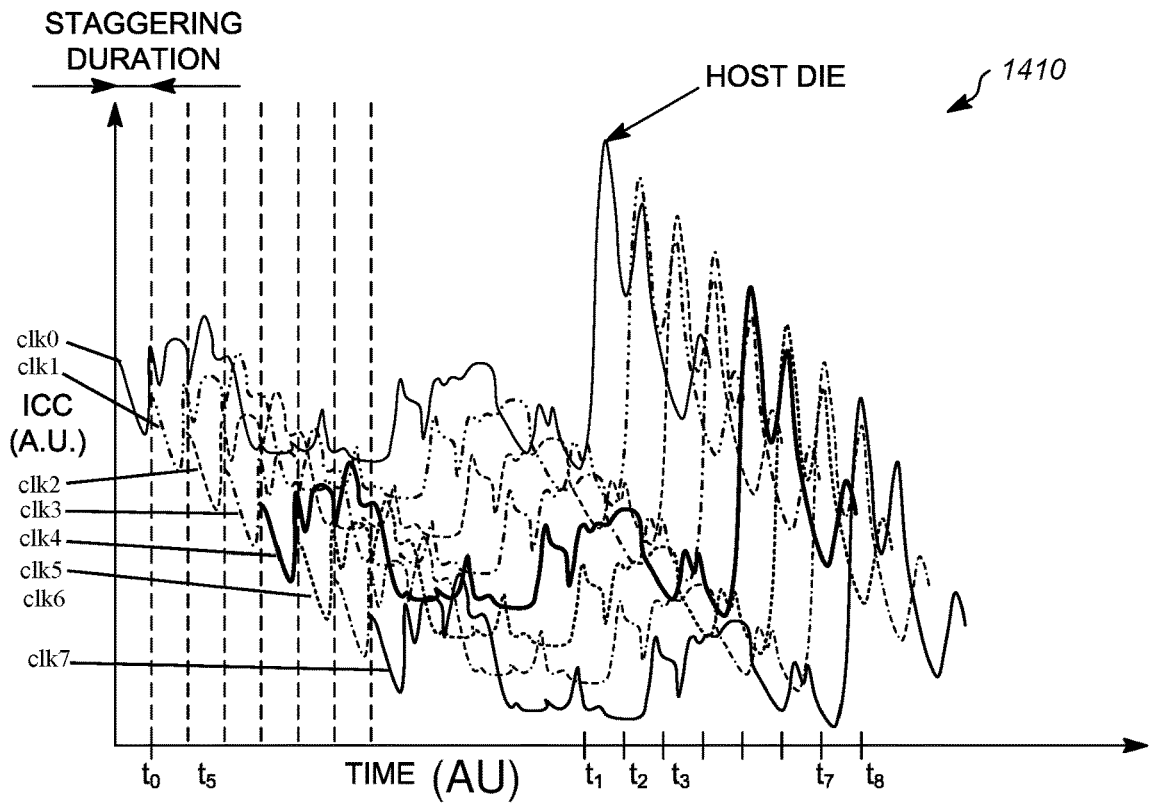
FIG. 14B depicts a timing diagram of current draw for a statically staggered operation of a plurality of memory dies.

FIG. 14B shows a graph 1410 with the Icc current on a multi-memory die system as a function of time. Here, the memory dies are operated with a static staggering of die operations. That is, each die operation is staggered by a set amount, the staggering duration is shown from $t_0$ to $t_5$. Thus, the last die among eight dies begins its operation seven stagger durations after the first die begins. This is performed regardless of need. However, the current peaks for each memory die, which occur at $t_1$ for memory die 1, $t_2$ for memory die 2, $t_3$ for memory die 3, $t_4$ for memory die 4, $t_5$ for memory die 5, $t_6$ for memory die 6, $t_7$ for memory die 7, is for memory die 8, are spaced from the current peaks of the other memory dies. This static staggering method requires clock synchronization of all of the dies. All dies need to know at least the clock information for the host die or all of the other clocks. The trade-off between peak power reduction vs. performance degradation is favorable. A blind static staggering of die operations at the beginning of program operation has demonstrated to be efficient based on emulation result for most of the events. However, it does not guarantee some rare case when peak alignment occurs at the middle of the program operation. Note that every memory die has different program verify counts in various program loops. Furthermore, the real system usage of NAND including program postpone for read operation makes static staggering for program operation becomes more complicate.

Figure 14C:
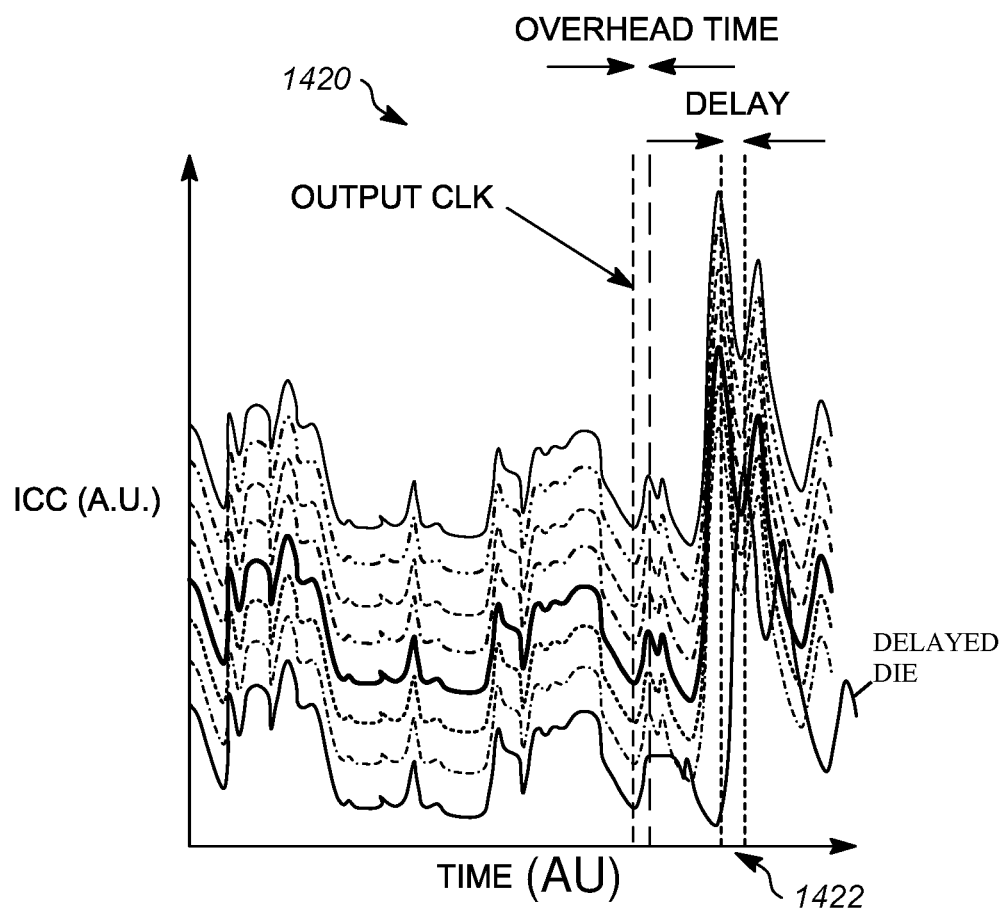
FIG. 14C depicts a timing diagrams of current draw for a dynamically staggered operation of a plurality of memory dies.

FIG. 14C shows a graph 1420 with the Icc current on a multi-memory die system as a function of time and showing an embodiment of the present disclosure. The output clock from the memory dies is received at the memory controller and it imposes a slight overhead time 1422 to the timing diagram, e.g., less than or equal to two microseconds. All dies output a single bit data when entering timing RR1. The controller counts if all memory dies (e.g., eight memory dies) RR1 signals appear within certain threshold time, e.g., the overhead time. If all are received within the threshold time, the memory controller can signal to instruct one or more die to delay and prevent current peak overlap. Thus, the memory controller can dynamically stagger some but not all memory dies to prevent the memory dies from exceeding the maximum current supply value.

In an example embodiment, delay decisions relative to the operation of the dies can be made, which reduces the likelihood that current draw by the dies would exceed the maximum current supplied to the memory dies. The controller can receive the clock signal from each of the memory dies and based on the clock received from each die, the controller can introduce at least one delay to the dies. In an example, the memory dies output their RR1 clock signals which are received at the controller during the RR3 clock (i.e., overhead time). The controller will store which the order and time of receipt of the RR1 signal for each die operably connected to the controller.

In an example embodiment, the eighth memory die is dynamically staggered relative to the other memory dies, e.g., delayed by the delay time. The delay time can be two microseconds. The other seven memory dies an operate on their present clock timing In another embodiment, two memory dies can be delayed. In another embodiment up to six memory dies can be delayed.

In an example embodiment, the dies send their clock signal to the controller. The dies operate on clocks that are independent from each other. The clocks are not synchronized to each other. Accordingly, the clock signals, e.g., RR1 signal, arrive at the controller at their own time. The clocks signals, clk0-clk7, from the dies (0-7) arrive at the controller at different times. In an example embodiment, the order of arrival of the clocks signals at the controller is clk0, clk2, clk6, clk1, clk4, clk3, clk7, clk7. The controller can decide to assign a delay to one or more of the dies based on the received clock signals clk0-clk7. The controller can assign a first delay to the third die and a second delay to the seventh die by sending a delay signal to the respective dies. The times for the first delay and the second delay can be different times, e.g., the first delay is less than the second delay. The other dies can continue to operate on their own clock. The controller can send a delay signal to the dies that are being instructed to delay. The delay signal can include the length of the delay. In another example embodiment, the controller receives the clock signals from each of the dies and issues delay instructions to each of the dies. In another example embodiment, the controller receives the clock signals from each of the dies and assigns a delay to each die except the die associated with the first arriving clock signal clk0-clk7.

In another example embodiment, the order of arrival of the die clocks signals at the controller is clk0, clk2, clk6, clk1, clk4, clk3, clk5, and clk7. The controller can decide to assign a delay to one or more of the dies based on the received clock signals clk0-clk7. The controller can assign a same time delay to more than one die. The controller can assign a same time delay to each of dies 4, 3, 5, and 7. In this example, the first arriving clock signals clk0, clk2, clk6, clk1, clk4, are assigned to a first group. The later arriving clock signals clk4, clk3, clk5, clk7, are assigned to a second group. The first group are not assigned a delay by the controller. The second group are assigned a delay, e.g., a single clock cycle, two clock cycles or a multiple thereof, to delay the operation of the dies in the second group.

When comparing the graphs 1401, 1410, 1420, it is clear that the dynamic staggering as described herein is closer to default operation of graph 1401 as compared to the static staggering of graph 1410 in which all dies are delayed or all but the first is delayed from the preceding memory die.

Overall program operation has several program pulses (e.g., fourteen 14 loops in some examples, see FIG. 14C). Each loop has one program pulse and followed by one or several program verify operation. Peak Icc occurs during inhibit BL ramping (P5 or RR6 depends on parameter DYNAMIC_INH). It increases when programming loop increases to a half of total programming loop and then decreases till the end of program operation. It can be difficult to predict the verify number for each program loop before the whole program operation starts. However, after each program pulse, NAND notices the verify count by PCV signal. Moreover, when NAND enters RR clk, the occurrence of peak Icc is fixed. The present methodology can use this information to stagger some or all of the memory dies.

With the hardware design to output specific clk and loop count, the occurrence of eight die's peak Icc can be avoided by the controller as the dies do not have knowledge of the other dies clock signals or operation state. The controller can delay operation of one or more dies and shift the operation of the one or more dies to prevent the dies from synchronous operating. The controller can indirectly prevent the too much current draw just by using the die clock signals to prevent synchronous operation of the dies.

With the present system, there is no need to poll ready/busy for each die since the memory die will output the signal to the memory controller, which makes the present system more effective. There is no need to configure extra RAM in the memory dies. The present disclosure may operate to prevent well alignment of peak Icc for all memory dies joined as a group with a single memory controller or single current source.

Figure 15:
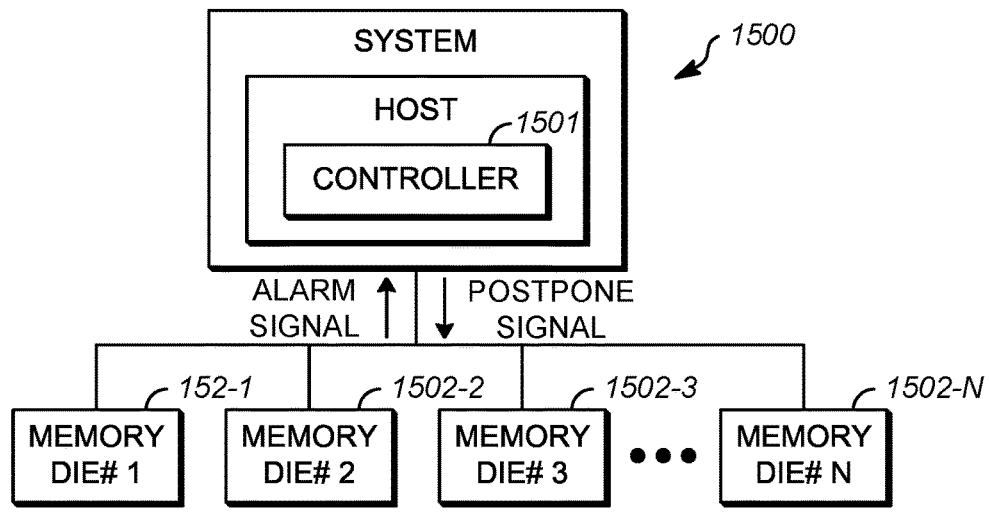
FIG. 15 illustrates a schematic block diagram of a controller and a plurality of memory dies according to an example embodiment.

FIG. 15 shows a memory sub-system 1500 with controller 1501 that interacts with the host device and controls multiple memory dies 1502-1, 1502-2, 1502-3, . . . 1502-N. In an example embodiment the number of memory dies is a factor of two, e.g., eight or more, 16, 32. The memory dies 1502 contain non-volatile memory cells, e.g., NAND memory cells as described herein, on-die control circuitry, and I/O latches. A communication bus 1503 transmits electrical signals between the controller 1501 and the memory dies 1502. The communication bus 1503 can transmit data bits to and from the memory dies 1502. The communication bus 1503 can transmit data bits representing the state of the memory dies, e.g., a single bit representing the RR1 timing state of any of the memory dies. The memory dies 1502 can output the specific clock signals, e.g., RR1 clock, RR5 clock, or previous R clock, if necessary.

The clock referred to on some embodiments refer to the clock signals used in various operations on the memory dies. For a MLC operation of a NAND nonvolatile memory, the R_CLK, IQPW_CLK, RWL_CLK, RR_CLK, P_CLK, PO_CLK, and PR_CLK signal sections may be used. Overall program operation has several program pulses (e.g., fourteen loops). Each loop has one program pulse and followed by one or several program verify operation. Peak Icc at each memory die occurs during inhibit BL ramping. (e.g., P5 or RR6 depending on parameter DYNAMIC_INH). In other aspects, the peak Icc at each memory die may occur during word line ramping (e.g., R2 program verify). The peak current increases when programming loop increases to a half of total programming loops and then decreases till the end of program operation. It may be difficult to predict the verify number for each program loop before the whole program operation starts. However, after each program pulse, the memory controller (e.g., a NAND controller) is notified the verify count by a signal from the memory die. Moreover, when a NAND memory die enters RR clock, the occurrence of peak Icc is fixed in time thereafter.

The total power budget of a storage device may include the power budget for data transfer and power budget for NAND erase/program/relocate operations. The NAND power budget may be based on the amount of NAND memory dies in a package, thus defining the peak Icc specification with consideration of the worst case scenario.

The memory sub-system 1500 may not have detail knowledge or capability to control at or about the peak current occurrence for each operation. Instead, the system 1500 may define a power budget for each operation. In this regard, whenever a specific action is operated, the power budget can guide the system 1500 until the end of the action and the system 1500 can then release the power budget. If the total power budget exceeds the total amount allowable, a later operation for a memory die can be postponed until the power budget is released. If micromanagement of peak current occurrence can be controlled, the system performance including the performance of the NAND memory dies (e.g., 1502-1, 1502-2, 1502-3, . . . 1502-N) can be further improved.

In some aspects, the peak current limitation from the host device 104 (e.g., host power budget) may be about 800 mA at 2 µs. In existing storage device technologies (e.g., BiCS4.5), the Icc peak draw by a memory die during a programming operation may typically be about 90 mA at 2 µs. A sequential write operation across a package with 8 memory dies may include a Icc peak draw of about 720 mA for a programming operation. Additionally, in some aspects, the transfer current consumption for a cache programming operation may be about 229 mA for a total Icc peak draw of about 949 mA at 2 µs for the 8-die package. In order to comply with the host power limitation, performance may be compromised to reduce the speed for write operations and disable cache programming when the power consumption may exceed the host power limitation. Different combinations of storage operations in an 8-die package also may result in a high peak current consumption. In this regard, a methodology that optimizes a staggered duration for peak Icc reduction as well as negligible performance loss is desirable for system performance improvement.

Each of the NAND memory dies (e.g., 1502-1, 1502-2, 1502-3, . . . 1502-N) can send an alarm signal to the controller 1501 when the NAND memory die detects it is about to enter an operational state that draws a peak current from the current source for the program operation (e.g., risky high peak CLK). This framework may require one pin output from each NAND memory die. The controller 1501 may constantly poll the alarm signal all the time.

In turn, the controller 1501 may issue a postpone signal to the NAND memory dies that sent an alarm signal. This framework would further require two trace pins between the controller 1501 and the NAND memory die, and up to 16 trace pins between the controller 1501 and all the NAND memory dies (for an 8-die package). In some aspects, the NAND memory dies may be grouped to reduce the pin count on the controller 1501. It is unlikely that the number of pins on the controller 1501 to receive the alarm signal and to output a postpone signal to a specific NAND memory die would increase (e.g., 2*(number of NAND memory dies)) in view of the significant increase in area costs and trace complexity. Instead, the signal of the pins are bundled together. However, determining which NAND memory die issued an alarm signal to postpone if needed would be very challenging since the communication paths between the NAND memory dies and the controller 1501 are bundled together.

The controller 1501 can constantly monitor for the alarm signal and take action when the controller 1501 receives a certain number of alarm signals within a certain threshold time since receiving a first alarm signal. For example, the controller 1501 may monitor for the alarm signal from one or more of the NAND memory dies (e.g., 1502-1, 1502-2, 1502-3, . . . 1502-N) on a first common channel between the controller 1501 and the NAND memory dies. In some aspects, the alarm signal can indicate that a corresponding memory die of the NAND memory dies is entering an operational state that draws a peak current from the current source for the program operation. In some aspects, the controller 1501 can delay a NAND die operation by a fixed duration (e.g., a time delay in a range of 4 μs to 10 μs). In some aspects, the controller 1501 can receive, from the plurality of memory dies 1502, one or more alarm signals on the first common channel within a predetermined threshold time. In turn, the controller 1501 may transmit a postpone signal on a second common channel to the plurality of memory dies 1502 based on the one or more alarm signals received within the predetermined threshold time. For example, if the controller 1501 receives a cumulative number of alarm signals with status indicating that six out of eight NAND memory dies are about to enter an operational state that draw a higher peak current (e.g., above an allowable maximum amount), then the controller 1501 may immediately cause the memory dies to postpone their respective storage operation by the fixed duration. In another aspect, the controller 1501 can suspend the NAND die operation and may provide further instruction to a NAND memory die to resume the suspended operation. In still other aspects, the controller 1501 may take no action.

Figure 16:
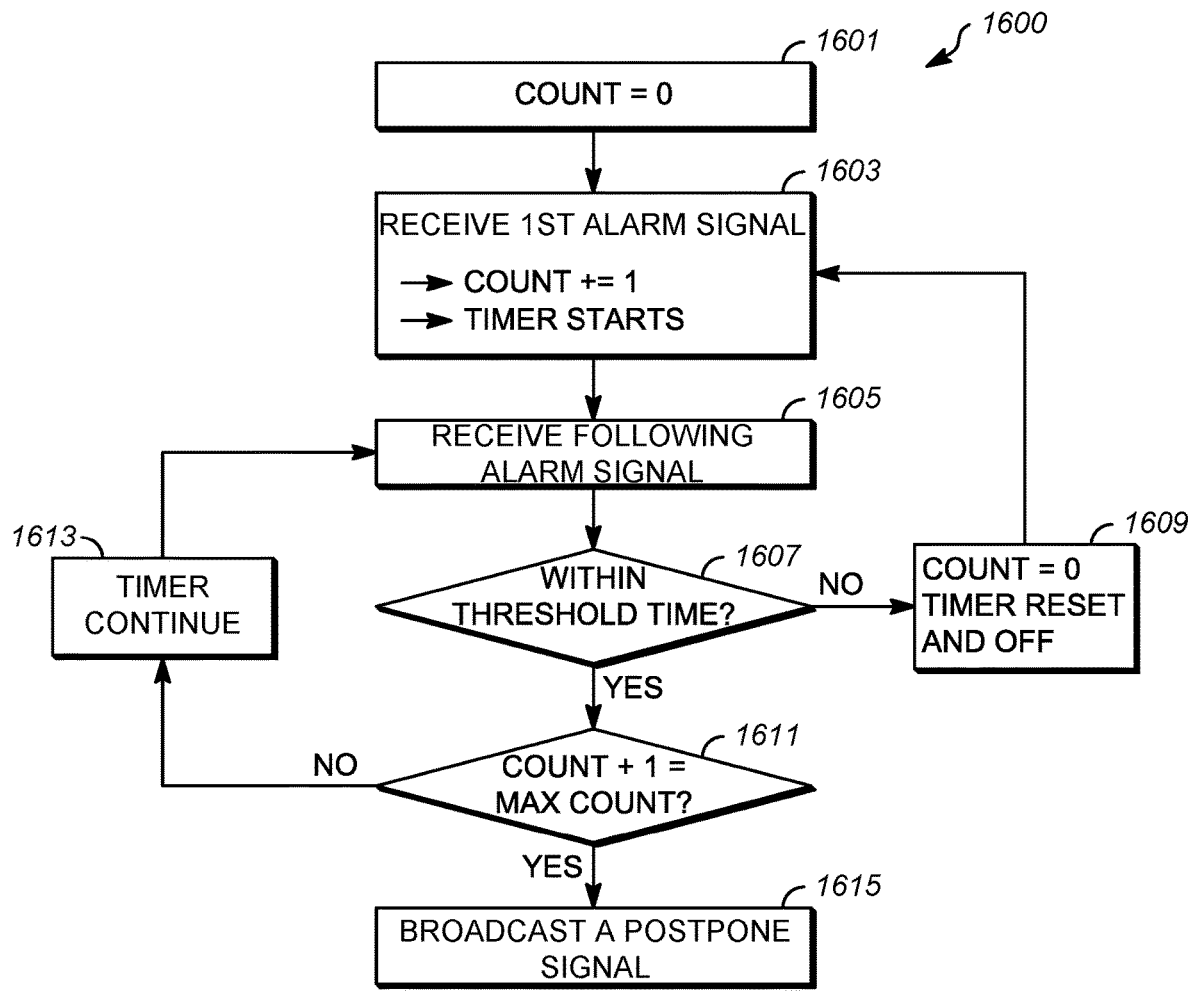
FIG. 16 depicts a flow chart for determining whether die program staggering is needed according to an example embodiment.

FIG. 16 shows a process flow 1600 for determining if the memory controller should broadcast a postpone signal that triggers a dynamic staggering of the operations of the memory dies under control of the memory controller. This can be performed using counts of the feedback digits from the memory dies to determine if the dies are in synch such that they will draw current in excess of the maximum current the memory controller can provide to the memory dies over a certain time period. These process flows can be performed on the memory sub-system of 1500 or the memory systems described with reference to FIGS. 1, 4, 11 and 12.

At 1601, the memory controller sets its count value in a counter to zero. This is done for a new state of the memory controller representing new commands being sent to the memory dies. The count value is stored internally in the memory controller. The count value represents the number of memory dies that will perform a certain function. The timer is used so that the certain functions be counted in the counter must occur within a certain time period in order to broadcast a postpone signal that triggers dynamic staggering of the operation(s) of the memory dies to prevent exceeding the maximum current draw from the memory controller or the maximum current available to the memory dies over a certain time period.

The timer counts down the time remaining in the threshold time value. In some examples, the predetermined threshold time corresponds to a duration of the peak current drawn by at least one of the plurality of memory dies during the program operation. In another example, this time value is set based on the plateau of the current peak. The plateau is defined as a width of current peaks that when summed together would exceed the maximum current value. For example, the predetermined threshold time can be about 2.0 μseconds. It has been shown that the peak current at the memory dies has the width in the time domain.

At 1603, the memory controller may receive a first alarm signal from the memory dies along the first common channel (e.g., bundled signal traces from the memory dies to the controller). When the first alarm signal is received, the memory controller starts a timer and increments the internal counter by one.

At 1605, the memory controller receives a following alarm signal from the memory dies after the timer has started. The memory controller can continually receive additional alarm signals from the memory dies. These alarm signals can represent various entries into an operational state that draws a peak current from the current source for the program operation by the respective memory die(s). The alarm signals may be received at different times within the predetermined threshold time.

At 1607, the memory controller determines if the new received alarm signal is received within the predetermined threshold time value. The threshold time value can be stored in the memory controller and programmed based on experimental values. If the new alarm signal is not received within the threshold time value, the process moves to step 1609. If the following alarm signal is received within the predetermined threshold time, the process moves to step 1611.

At 1609, the timer is reset and deactivated until the next alarm signal is received. The count is reset to zero.

At 1611, the internal counter is incremented by one and a determination is made if the count is equals to a stored max count number. In some examples, the count value corresponds to a number of the plurality of memory dies that have issued an alarm signal that at least in part overlap with one another within the predetermined threshold time. The controller may determine whether the one or more alarm signals received within the predetermined threshold time corresponds to a number of alarm signals that exceeds a threshold number (e.g., a maximum count value). The maximum count value may be based on an allowable amount of the peak current to be drawn concurrently by the one or more of the plurality of memory dies for a duration within the predetermined threshold time. In this regard, the maximum count value is the maximum number of dies that are performing a certain operation, e.g., programming, before the maximum current value is exceeded. For example, for some NAND system if eight memory dies are all performing a programming operation at the same time and that would exceed the maximum current value, then the max count is set to eight. If only seven memory dies need to be performing the same operation to exceed the maximum current value, then the max count value is set to seven. If not, the process moves to step 1613 and the timer continues to run and the memory controller await to receive more alarm signal values at step 1605. If yes at step 1611, then the process moves to step 1615.

At 1615, the memory controller broadcasts a postpone signal to the plurality of memory dies over a second common channel (e.g., bundled signal traces from the controller to the memory dies). In some aspects, the first common channel and the second common channel correspond to a same signal trace between the controller and the memory dies. In some aspects, the controller can generate the postpone signal when the one or more alarm signals received within the predetermined threshold time corresponds to the number of alarm signals that equals (or exceeds) the threshold number. In some aspects, the postpone signal can trigger dynamic staggering of the operations in the memory dies. At least one memory die may be instructed to postpone (or delay) its action relative to another memory die. For example, the postpone signal can cause at least one of the plurality of memory dies to delay an ongoing storage operation by a fixed duration when the postpone signal is received at the at least one of the plurality of memory dies within a predetermined timing window following issuance of a corresponding alarm signal.

This process allows the memory sub-system to operate at a usual speed and normal order of operation, i.e., no delays to prevent violation of maximum current value available to the memory dies. This process also does not require a static staggering of operation, which always occurs and degrades performance.

Figure 17:
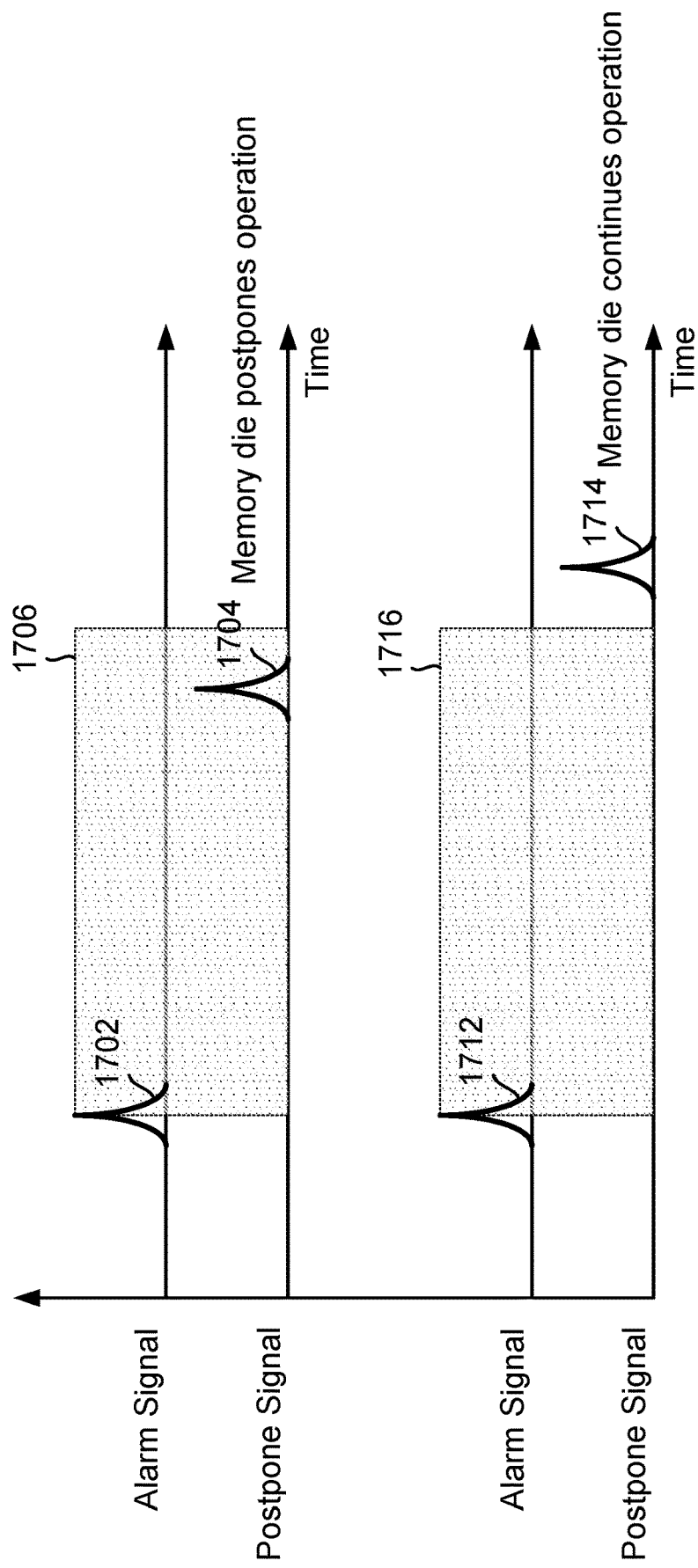
FIG. 17 illustrates a timing diagram of an alarm signal and a postpone signal relative to a timing window according to an example embodiment.

FIG. 17 illustrates a timing diagram of an alarm signal and a postpone signal relative to a timing window according to an example embodiment. This framework would require two separate trace pins between a controller (e.g., 123, 1244, 1501) and the memory dies (e.g., 1502). However, in an effort to minimize the area costs by reducing the pin count on the controller, the signal paths between the controller and the memory dies are bundled in both traffic directions such that the signal traffic from the controller to the memory dies is a common channel with the signal traffic from the memory dies to the controller.

At the controller, if the controller receives a certain number of alarm signals 1702 within a defined threshold time (e.g., 1706) since the first alarm signal is received, then the controller can broadcast a postpone signal (e.g., 1704, 1714) to all the NAND memory dies via a first common channel from the controller to the memory dies.

For each individual NAND memory die, when the NAND memory die outputs an alarm signal (e.g., 1702, 1712), the NAND memory die expects to receive a postpone signal (e.g., 1704, 1714) within a certain timing window (e.g., 1706, 1716). The NAND memory die is expected to postpone an ongoing storage operation when a postpone signal is received by the memory die within the timing window. For example, if the postpone signal 1704 is received by the NAND memory die within the timing window 1706, then the NAND memory die postpones a current storage operation. However, if the postpone signal 1714 is not received by the NAND memory die within the timing window 1716, then the NAND memory die continues the current storage operation.

Figure 18:
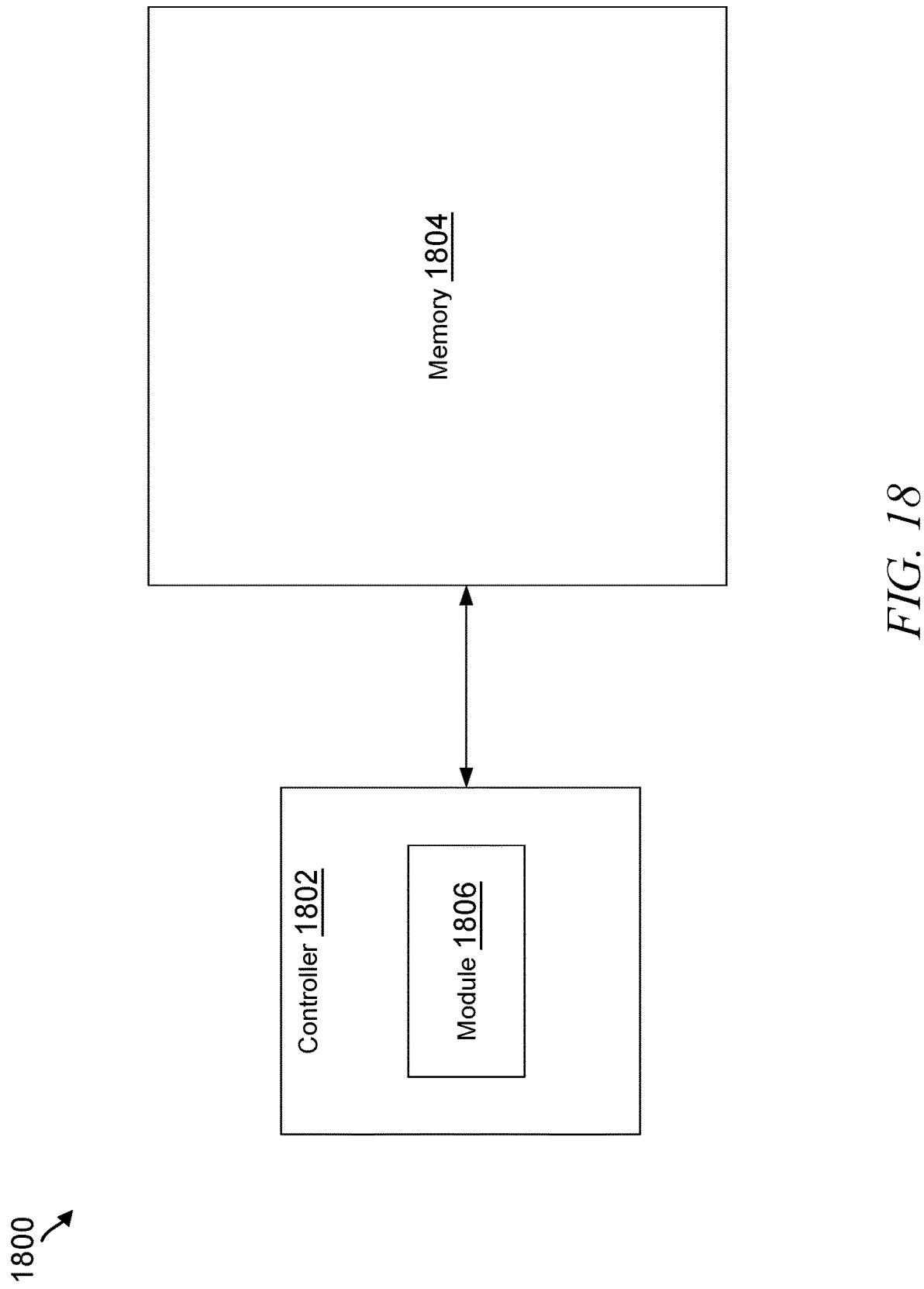
FIG. 18 is a conceptual diagram illustrating an example of a controller using dual time domain control for dynamic staggering of FIG. 1.

FIG. 18 is a conceptual diagram illustrating an example of a controller using dual time domain control for dynamic staggering of FIG. 1. As illustrated in FIG. 18, a controller 1802 coupled to a memory 1804 in a storage device. For example, controller 1802 may correspond to controller 123 and memory 1804 may correspond to the NVM 110 of the storage device 182 in FIG. 1. The controller may be implemented in software, hardware, or a combination of hardware and software. In one exemplary embodiment, the controller is implemented with several software modules executed on one or more processors, but as those skilled in the art will appreciate, the controller may be implemented in different ways. The skilled artisan will readily understand how best to implement the controller based on the particular design parameters of the system.

The controller 1802 may include a module 1806 that may provide a means for monitoring for an alarm signal from one or more of the plurality of memory dies on a first common channel between the controller and the plurality of memory dies. For example, the module 1806 may perform the aforementioned process described at 1603. In some aspects, the alarm signal indicates that a corresponding memory die of the plurality of memory dies is entering an operational state that draws a peak current from the current source for the program operation. In one configuration, the module may be further configured to read the first data from the system-level memory location when the page data is available at the system-level memory location, e.g., as described in connection with 1608. In one configuration, the module may be further configured to receive, from the plurality of memory dies, one or more alarm signals on the first common channel within a predetermined threshold time, e.g., as described in connection with 1605. The controller 1802 may provide a means for transmitting a postpone signal on a second common channel to the plurality of memory dies based on the one or more alarm signals received within the predetermined threshold time. For example, the module 1806 may perform the aforementioned process described at 1615.

Accordingly, the controller described in the present disclosure improves memory programming performance of the storage device by reducing peak current consumption during a programming operation. For instance, the controller may broadcast a postpone signal over a bundled signal path to all memory dies to trigger a dynamic staggering of peak current occurrences by respective memory dies. Accordingly, the dual time domain control for dynamic staggering may be accomplished with minimal changes to controller logic and memory capacity requirements.

The various aspects of this disclosure are provided to enable one of ordinary skill in the art to practice the present disclosure. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
a memory comprising a plurality of memory dies, wherein each of the plurality of memory dies draws a current from a current source during a program operation; and
a controller coupled to the memory and configured to:
monitor for an alarm signal from one or more of the plurality of memory dies on a first common channel between the controller and the plurality of memory dies, the alarm signal indicating that a corresponding memory die of the plurality of memory dies is entering an operational state that draws a peak current from the current source for the program operation;

receive, from the plurality of memory dies, one or more alarm signals on the first common channel within a predetermined threshold time; and transmit a postpone signal on a second common channel to the plurality of memory dies based on the one or more alarm signals received within the predetermined threshold time.

2. The storage device of claim 1, wherein the one or more alarm signals are received at different times within the predetermined threshold time.

3. The storage device of claim 1, wherein the controller is further configured to:

determine whether the one or more alarm signals received within the predetermined threshold time corresponds to a number of alarm signals that exceeds a threshold number; and generate the postpone signal when the one or more alarm signals received within the predetermined threshold time corresponds to the number of alarm signals that exceeds the threshold number.

4. The storage device of claim 1, wherein the postpone signal is broadcast to the plurality of memory dies over the second common channel.

5. The storage device of claim 1, wherein the predetermined threshold time corresponds to a duration of the peak current drawn by at least one of the plurality of memory dies during the program operation.

6. The storage device of claim 1, wherein the first common channel and the second common channel correspond to a same signal trace between the controller and the plurality of memory dies.

7. The storage device of claim 1, wherein the controller is further configured to:

receive a first alarm signal from a first memory die of the plurality of memory dies on the first common channel;

initiate, in response to the first alarm signal, a counter to determine a count value of alarm signals received from the plurality of memory dies;

initiate, in response to the first alarm signal, a timer to measure the predetermined threshold time;

receive a second alarm signal from a second memory die of the plurality of memory dies on the first common channel;

determine whether the second alarm signal is received within the predetermined threshold time;

increment the count value when the second alarm signal is received within the predetermined threshold time;

reset the count value when the second alarm signal is not received within the predetermined threshold time;

determine whether the count value corresponds to a maximum count value;

resume the timer when the count value does not correspond to the maximum count value; and generate the postpone signal when the count value corresponds to the maximum count value.

8. The storage device of claim 7, wherein the count value corresponds to a number of the plurality of memory dies that have issued an alarm signal that at least in part overlap with one another within the predetermined threshold time.

9. The storage device of claim 7, wherein the maximum count value is based on an allowable amount of the peak current to be drawn concurrently by the one or more of the plurality of memory dies for a duration within the predetermined threshold time.

10. The storage device of claim 1, wherein the postpone signal causes at least one of the plurality of memory dies to delay an ongoing storage operation by a fixed duration when the postpone signal is received at the at least one of the plurality of memory dies within a predetermined timing window following issuance of a corresponding alarm signal.

11. A storage device, comprising:

a memory comprising a plurality of memory dies; and a controller coupled to the memory and configured to:

monitor for an alarm signal from one or more of the plurality of memory dies on a first common channel between the controller and the plurality of memory dies;

receive, from the plurality of memory dies, one or more alarm signals on the first common channel within a predetermined threshold time; and transmit a postpone signal on a second common channel to the plurality of memory dies based on the one or more alarm signals received within the predetermined threshold time.

12. The storage device of claim 11, wherein each of the plurality of memory dies draws a current from a current source during a program operation.

13. The storage device of claim 11, wherein the alarm signal indicates that a corresponding memory die of the plurality of memory dies is entering an operational state that draws a peak current from a current source for a program operation.

14. The storage device of claim 11, wherein the controller is further configured to:

determine whether the one or more alarm signals received within the predetermined threshold time corresponds to a number of alarm signals that exceeds a threshold number; and generate the postpone signal when the one or more alarm signals received within the predetermined threshold time corresponds to the number of alarm signals that exceeds the threshold number.

15. The storage device of claim 11, wherein the postpone signal is broadcast to the plurality of memory dies over the second common channel.

16. The storage device of claim 11, wherein the predetermined threshold time corresponds to a duration of a peak current drawn by at least one of the plurality of memory dies during a program operation.

17. A storage device, comprising:

a plurality of memory dies configured to draw a current from a current source during a program operation; and a controller coupled to the plurality of memory dies and configured to:

monitor for an alarm signal from one or more of the plurality of memory dies on a first common channel between the controller and the plurality of memory dies, the alarm signal indicating that a corresponding memory die of the plurality of memory dies is entering an operational state that draws a peak current from the current source for the program operation;

receive, from the plurality of memory dies, one or more alarm signals on the first common channel within a predetermined threshold time; and transmit a postpone signal on a second common channel to the plurality of memory dies based on the one or more alarm signals received within the predetermined threshold time.

18. The storage device of claim 17, wherein the controller is further configured to:
- determine whether the one or more alarm signals received within the predetermined threshold time corresponds to a number of alarm signals that exceeds a threshold number; and
- generate the postpone signal when the one or more alarm signals received within the predetermined threshold time corresponds to the number of alarm signals that exceeds the threshold number.

19. The storage device of claim 17, wherein the postpone signal is broadcast to the plurality of memory dies over the second common channel.

20. The storage device of claim 17, wherein the postpone signal causes at least one of the plurality of memory dies to delay an ongoing storage operation by a fixed duration when the postpone signal is received at the at least one of the plurality of memory dies within a predetermined timing window following issuance of a corresponding alarm signal.

* * * * *